(12) United States Patent
Estay Forno et al.

(10) Patent No.: US 12,388,458 B2
(45) Date of Patent: Aug. 12, 2025

(54) METHODS, APPARATUS, AND ARTICLES OF MANUFACTURE TO REDUCE LEAKAGE CURRENT IN SAMPLING CIRCUITRY

(71) Applicant: Texas Instruments Incorporated, Dallas, TX (US)

(72) Inventors: Ignacio Estay Forno, Tuscon, AZ (US); Nanqi Liu, Tuscon, AZ (US); Yu-Wen Kuo, Tuscon, AZ (US); Dhyey Naren Desai, Tuscon, AZ (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 213 days.

(21) Appl. No.: 18/222,172

(22) Filed: Jul. 14, 2023

(65) Prior Publication Data
US 2025/0023577 A1    Jan. 16, 2025

(51) Int. Cl.
*H03M 1/12*    (2006.01)
*H03M 1/00*    (2006.01)
*H03M 1/40*    (2006.01)

(52) U.S. Cl.
CPC ......... *H03M 1/1255* (2013.01); *H03M 1/002* (2013.01); *H03M 1/403* (2013.01)

(58) Field of Classification Search
CPC ..... H03M 1/1255; H03M 1/002; H03M 1/403
USPC ................... 341/115, 122, 141, 155
See application file for complete search history.

(56) References Cited

U.S. PATENT DOCUMENTS 10,916,321 B2 *   2/2021   Wappis ............... H03M 1/1245

OTHER PUBLICATIONS

"EECS 247 Lecture 10: Switched-Capacitor Filters," 2008, 28 pages. Retrieved from https://inst.eecs.berkeley.edu/~ee247/fa08/files07/lectures/L10s_f08.pdf.
Texas Instruments, "ADS131M04 4-Channel, Simultaneously-Sampling, 24-Bit, Delta-Sigma ADC," last revised in May 2021, 105 pages.
Texas Instruments, "ADS127L11 400-kSPS, Wide-Bandwidth, 24-Bit, Delta-Sigma ADC," last revised in Sep. 2022, 90 pages.
Wikipedia, "Switched capacitor," retrieved from https://en.wikipedia.org/w/index.php?title=Switched_capacitor&oldid=1116058467 on Apr. 11, 2023, 7 pages.

* cited by examiner

*Primary Examiner* — Khai M Nguyen
(74) *Attorney, Agent, or Firm* — Mandy Barsilai Fernandez; Frank D. Cimino

(57) ABSTRACT

An example apparatus includes bias control circuitry and sampling circuitry. The example sampling circuitry includes a first switch coupled to a first capacitor in series between an input voltage terminal and a common mode voltage terminal, the first switch including a first terminal coupled to the input voltage terminal. Additionally, the example sampling circuitry includes a second switch coupled to a second capacitor in series between the input voltage terminal and the common mode voltage terminal, the second switch including a first terminal coupled to the input voltage terminal. The example sampling circuitry also includes a third switch including a first terminal, a second terminal, and a control terminal, the first terminal of the third switch coupled to a power supply terminal, the second terminal of the third switch coupled between the first switch and the first capacitor, the control terminal coupled to the bias control circuitry.

20 Claims, 12 Drawing Sheets

METHODS, APPARATUS, AND ARTICLES OF MANUFACTURE TO REDUCE LEAKAGE CURRENT IN SAMPLING CIRCUITRY

TECHNICAL FIELD

This description relates generally to sampling circuitry and, more particularly, to methods, apparatus, and articles of manufacture to reduce leakage current in sampling circuitry.

BACKGROUND

Switched capacitor circuits are utilized to move charges into and/or out of capacitor(s) when switches are opened and/or closed. Generally, non-overlapping clock signals are utilized to control the switches so that not all the switches are closed simultaneously. Switched capacitor circuits are popular in integrated circuits (ICs) at least because a capacitor and an associated switching frequency can be utilized to simulate a resistance value more economically than including a precise resistor in an IC. Switched capacitor circuits can be used in sampling circuitry, such as analog to digital converters (ADCs), to sample an analog voltage in a first operational phase and provide, in a second operational phase, the sampled value to other circuitry for processing.

SUMMARY

For methods, apparatus, and articles of manufacture to reduce leakage current in sampling circuitry, an example apparatus includes bias control circuitry and sampling circuitry. The example sampling circuitry includes a first switch coupled to a first capacitor in series between an input voltage terminal and a common mode voltage terminal, the first switch including a first terminal coupled to the input voltage terminal. Additionally, the example sampling circuitry includes a second switch coupled to a second capacitor in series between the input voltage terminal and the common mode voltage terminal, the second switch including a first terminal coupled to the input voltage terminal. The example sampling circuitry also includes a third switch including a first terminal, a second terminal, and a control terminal, the first terminal of the third switch coupled to a supply terminal, the second terminal of the third switch coupled between the first switch and the first capacitor, the control terminal coupled to the bias control circuitry.

BRIEF DESCRIPTION OF THE DRAWINGS

The same reference numbers or other reference designators are used in the drawings to designate the same or similar (functionally and/or structurally) features.

DETAILED DESCRIPTION

Figure 1:
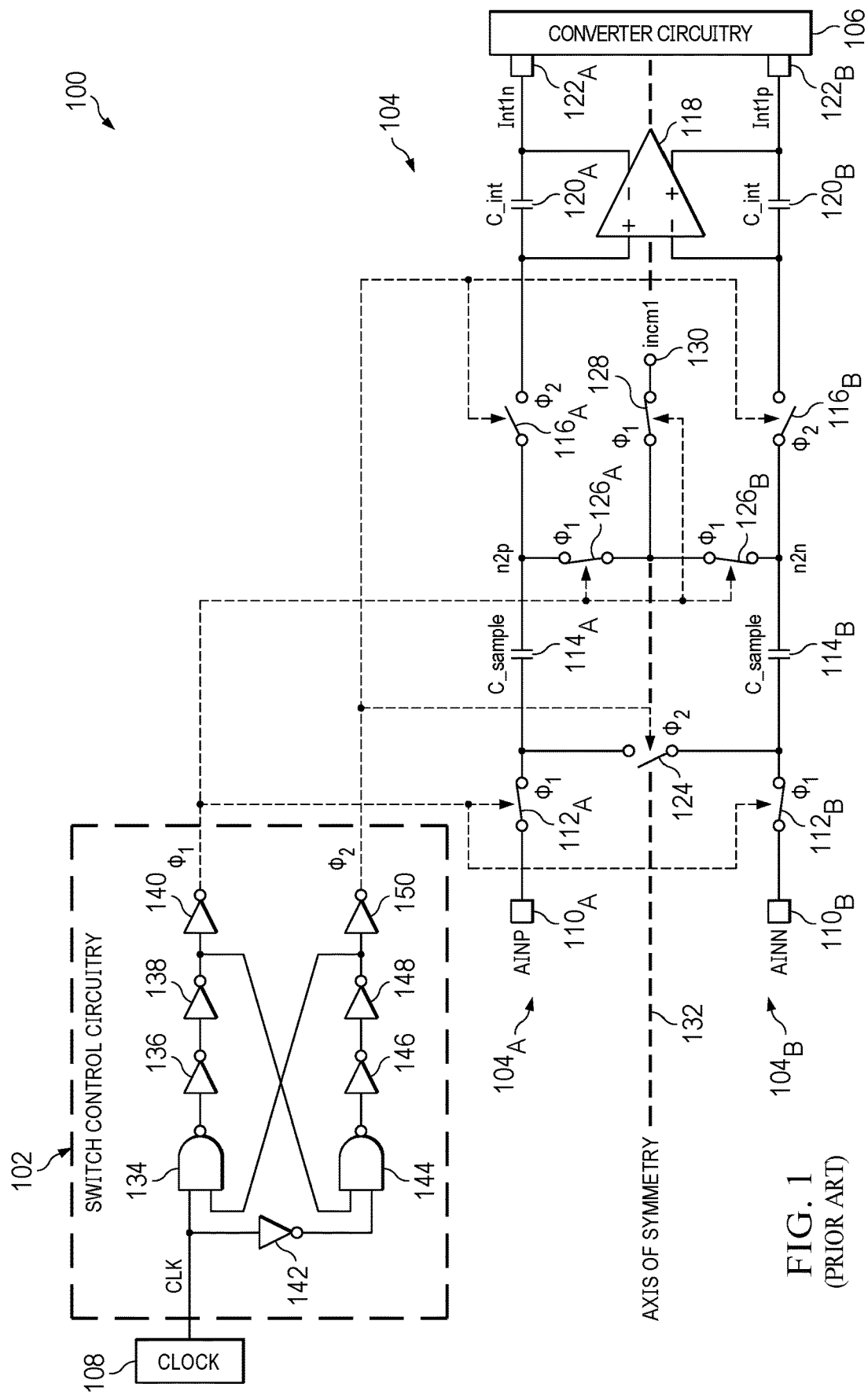
FIG. 1 is a block diagram of an example analog to digital converter (ADC) in which example switch control circuitry operates to control example sampling circuitry to operate in a first operational phase and a second operational phase.

The drawings are not necessarily to scale. Generally, the same reference numbers in the drawing(s) and this description refer to the same or like parts. Although the drawings show regions with clean lines and boundaries, some or all of these lines and/or boundaries may be idealized. In reality, the boundaries and/or lines may be unobservable, blended and/or irregular.

FIG. 1 is a block diagram of an example ADC 100 in which example switch control circuitry 102 operates to control example sampling circuitry 104 to operate in a first operational phase and a second operational phase. In the example of FIG. 1, the ADC 100 includes the example switch control circuitry 102, the example sampling circuitry 104, example converter circuitry 106, and an example clock 108. The example switch control circuitry 102 of FIG. 1 control the sampling circuitry 104 based on the clock 108.

In the illustrated example of FIG. 1, the clock 108 is implemented by an oscillator. For example, the clock 108 includes a piezoelectric quartz crystal. In additional or alternative examples, the clock 108 includes a polycrystalline ceramic. In the example of FIG. 1, the clock 108, when excited by a voltage, generates an oscillating clock signal identified as CLK. In the example of FIG. 1, the clock signal generated by the clock 108 is a square wave.

In the illustrated example of FIG. 1, the sampling circuitry 104 includes example positive sampling circuitry $104_A$ and example negative sampling circuitry $104_B$. The example positive sampling circuitry $104_A$ includes an example positive analog input terminal $110_A$, a first example switch $112_A$, an example sampling capacitor $114_A$, a second example switch $116_A$, an example operational amplifier (op-amp) 118, an example integrating capacitor $120_A$, and an example negative integrated output terminal $122_A$. Additionally, the example positive sampling circuitry $104_A$ includes a third example switch 124, a fourth example switch $126_A$, a fifth example switch 128, and an example common mode voltage terminal 130.

In the illustrated example of FIG. 1, the sampling circuitry 104 is symmetrical across an example axis of symmetry 132. In the example of FIG. 1, the axis of symmetry 132 provides an axis of symmetry between the positive sampling circuitry $104_A$ and the negative sampling circuitry $104_B$. For example, the negative sampling circuitry $104_B$ includes an example sampling capacitor $114_B$ implemented similarly to the sampling capacitor $114_A$ of the positive sample circuitry $104_A$. In the example of FIG. 1, the op-amp 118, the third switch 124, the fifth switch 128, and the common mode voltage terminal 130 are positioned on the axis of symmetry 132 and are not replicated across the axis of symmetry 132.

In the illustrated example of FIG. 1, a first terminal of the first switch $112_A$ is coupled to the positive analog input terminal $110_A$. In the example of FIG. 1, a second terminal of the first switch $112_A$ is coupled to a first terminal of the third switch 124 and a first terminal of the sampling capacitor $114_A$. In the example of FIG. 1, a control terminal of the first switch $112_A$ is coupled to a first output terminal of the switch control circuitry 102. In the example of FIG. 1, a first terminal of the sampling capacitor $114_A$ is coupled to the second terminal of the first switch $112_A$ and the first terminal of the third switch 124. In the example of FIG. 1, a second terminal of the sampling capacitor $114_A$ is coupled to a first terminal of the second switch $116_A$ and a first terminal of the fourth switch $126_A$.

In the illustrated example of FIG. 1, the first terminal of the second switch $116_A$ is coupled to the second terminal of the sampling capacitor $114_A$ and the first terminal of the fourth switch $126_A$. In the example of FIG. 1, a second terminal of the second switch $116_A$ is coupled to a first terminal of the integrating capacitor $120_A$ and a non-inverting input terminal of the op-amp 118. In the example of FIG. 1, a control terminal of the second switch $116_A$ is coupled to a second output terminal of the switch control circuitry 102. In the example of FIG. 1, the non-inverting input terminal of the op-amp 118 is coupled to the second terminal of the second switch $116_A$ and the first terminal of the integrating capacitor $120_A$. In the example of FIG. 1, an example inverting output terminal of the op-amp 118 is coupled to a second terminal of the integrating capacitor $120_A$ and the negative integrated output terminal $122_A$.

In the illustrated example of FIG. 1, the first terminal of the integrating capacitor $120_A$ is coupled to the second terminal of the second switch $116_A$ and the non-inverting input terminal of the op-amp 118. In the example of FIG. 1, the second terminal of the integrating capacitor $120_A$ is coupled to the negative integrated output terminal $122_A$ and the inverting output terminal of the op-amp 118. In the example of FIG. 1, the negative integrated output terminal $122_A$ is coupled to the second terminal of the integrating capacitor $120_A$, the inverting output terminal of the op-amp 118, and the converter circuitry 106. In the example of FIG. 1, the first terminal of the third switch 124 is coupled to the second terminal of the first switch $112_A$ and the first terminal of the sampling capacitor $114_A$. In the example of FIG. 1, a second terminal of the third switch 124 is coupled to a second terminal of a first example switch $112_B$ and a first terminal of the sampling capacitor $114_B$. In the example of FIG. 1, a control terminal of the third switch 124 is coupled to the second output terminal of the switch control circuitry 102.

In the illustrated example of FIG. 1, the first terminal of the fourth switch $126_A$ is coupled to the second terminal of the sampling capacitor $114_A$ and the first terminal of the second switch $116_A$. In the example of FIG. 1, a second terminal of the fourth switch $126_A$ is coupled to a first terminal of the fifth switch 128, and a second terminal of a fourth example switch $126_B$. In the example of FIG. 1, a control terminal of the fourth switch $126_A$ is coupled to the first output terminal of the switch control circuitry 102. In the example of FIG. 1, the first terminal of the fifth switch 128 is coupled to the second terminal of the fourth switch $126_A$ and the second terminal of the fourth switch $126_B$. In the example of FIG. 1, a second terminal of the fifth switch 128 is coupled to the common mode voltage terminal 130. In the example of FIG. 1, a control terminal of the fifth switch 128 is coupled to the first output terminal of the switch control circuitry 102.

In the illustrated example of FIG. 1, the sampling circuitry 104 receives a differential input signal (e.g., at the positive analog input terminal $110_A$ and an example negative analog input terminal $110_B$). During the first operational phase (e.g., a sampling phase), the switch control circuitry 102 controls the first switch $112_A$ (and the first switch $112_B$), the fourth switch $126_A$ (and the fourth switch $126_B$), and the fifth switch 128 to be closed. Additionally, during the first operational phase (e.g., the sampling phase), the switch control circuitry 102 controls the second switch $116_A$ (and a second example switch $116_B$) and the third switch 124 to be open. As such, during the first operational phase of the sampling circuitry 104, the first switch $112_A$ and the sampling capacitor $114_A$ are coupled in series between an input voltage terminal (e.g., the positive analog input terminal $110_A$) and a common mode voltage terminal (e.g., the common mode voltage terminal 130). In the example of FIG. 1, the common mode voltage terminal 130 is set to a common mode voltage of the sampling circuitry 104. For example, the common mode voltage is equal to one half the sum of the voltage at the positive analog input terminal $110_A$ and the negative analog input terminal $110_B$. In this manner, during the first operational phase, the sampling circuitry 104 samples the differential input signal via the sampling capacitor $114_A$ and the sampling capacitor $114_B$.

In the illustrated example of FIG. 1, during the second operational phase (e.g., a charge transfer phase), the switch control circuitry 102 controls the first switch $112_A$ (and the first switch $112_B$), the fourth switch $126_A$ (and the fourth switch $126_B$), and the fifth switch 128 to be open. Additionally, during the second operational phase (e.g., the charge transfer phase), the switch control circuitry 102 controls the second switch $116_A$ (and the second switch $116_B$) and the third switch 124 to be close. In this manner, during the second operational phase, the first terminal of the sampling capacitor $114_A$ and the first terminal of the sampling capacitor $114_B$ are shorted together. As such, the third switch 124 operates as a shorting control switch. Additionally, during the second operational phase, the second terminal of the sampling capacitor $114_A$ is coupled to the first terminal of the integrating capacitor $120_A$ and the non-inverting input terminal of the op-amp 118. As such, the second switch $116_A$ operates as a charge transfer switch. Furthermore, during the second operational phase, the second terminal of the sampling capacitor $114_B$ is coupled to the first terminal of the integrating capacitor $120_B$ and an example inverting input terminal of the op-amp 118. In this manner, during the second operational phase, the differential charge across the sampling capacitor $114_A$ and the sampling capacitor $114_B$ is nullified by passing the charge onto the integrating capacitor $120_A$ and the integrating capacitor $120_B$ in the feedback loops of the op-amp 118.

In the illustrated example of FIG. 1, the converter circuitry 106 is coupled to the negative integrated output terminal $122_A$ and an example positive integrated output terminal $122_B$. In the example of FIG. 1, the converter circuitry 106 converts an analog signal sampled by the sampling circuitry 104 into a digital signal. For example, the converter circuitry 106 outputs a two's complement binary value that is proportional to an input analog value.

In the illustrated example of FIG. 1, the switching control circuitry 102 includes a first example NAND gate 134, a first example NOT gate 136, a second example NOT gate 138, and a third example NOT gate 140. Additionally, the example switching control circuitry 102 includes a fourth example NOT gate 142, a second example NAND gate 144, a fifth example NOT gate 146, a sixth example NOT gate 148, and a seventh example NOT gate 150. In the example of FIG. 1, a first input terminal of the first NAND gate 134 is coupled to the clock 108 and an input terminal of the fourth NOT gate 142. Additionally, in the example of FIG. 1, a second input terminal of the first NAND gate 134 is coupled to an output terminal of the sixth NOT gate 148 and an input terminal of the seventh NOT gate 150. In the example of FIG. 1, an output terminal of the first NAND gate 134 is coupled to an input terminal of the first NOT gate 136.

In the illustrated example of FIG. 1, the input terminal of the first NOT gate 136 is coupled to the output terminal of the first NAND gate 134. Additionally, in the example of FIG. 1, an output terminal of the first NOT gate 136 is coupled to an input terminal of the second NOT gate 138. In the example of FIG. 1, the input terminal of the second NOT gate 138 is coupled to the output terminal of the first NOT gate 136. Additionally, in the example of FIG. 1, an output terminal of the second NOT gate 138 is coupled to an input terminal of the third NOT gate 140 and a first input terminal of the second NAND gate 144. In the example of FIG. 1, the input terminal of the third NOT gate 140 is coupled to the output terminal of the second NOT gate 138 and the first input terminal of the second NAND gate 144. In the example of FIG. 1, an output terminal of the third NOT gate 140 is coupled to the control terminal of the first switch $112_A$, a control terminal of the first switch $112_B$, the control terminal of the fourth switch $126_A$, a control terminal of the fourth switch $126_B$, and the control terminal of the fifth switch 128. In this manner, the output terminal of the third NOT gate 140 operates as the first output terminal of the switch control circuitry 102.

In the illustrated example of FIG. 1, the input terminal of the fourth NOT gate 142 is coupled to the clock 108 and the first input terminal of the first NAND gate 134. In the example of FIG. 1, an output terminal of the fourth NOT gate 142 is coupled to a second input terminal of the second NAND gate 144. Additionally, in the example of FIG. 1, the first input terminal of the second NAND gate 144 is coupled to output terminal of the second NOT gate 138 and the input terminal of the third NOT gate 140. In the example of FIG. 1, the second input terminal of the second NAND gate 144 is coupled to the output terminal of the fourth NOT gate 142. Additionally, in the example of FIG. 1, an output terminal of the second NAND gate 144 is coupled to an input terminal of the fifth NOT gate 146.

In the illustrated example of FIG. 1, the input terminal of the fifth NOT gate 146 is coupled to the output terminal of the second NAND gate 144. In the example of FIG. 1, an output terminal of the fifth NOT gate 146 is coupled to an input terminal of the sixth NOT gate 148. Additionally, in the example of FIG. 1, the input terminal of the sixth NOT gate 148 is coupled to the output terminal of the fifth NOT gate 146. In the example of FIG. 1, the output terminal of the sixth NOT gate 148 is coupled to the input terminal of the seventh NOT gate 150 and the second input terminal of the first NAND gate 134. In the example of FIG. 1, the input terminal of the seventh NOT gate 150 is coupled to the output terminal of the sixth NOT gate 148 and the second input terminal of the first NAND gate 134. Additionally, in the example of FIG. 1, an output terminal of the seventh NOT gate 150 is coupled to the control terminal of the second switch $116_A$, a control terminal of the second switch $116_B$, and the control terminal of the third switch 124. In this manner, the output terminal of the seventh NOT gate 150 operates as the second output terminal of the switch control circuitry 102.

In the illustrated example of FIG. 1, the switch control circuitry 102 operates based on the clock signal, CLK, generated by the clock 108. In the example of FIG. 1, based on a rising edge of the clock signal, the switch control circuitry 102 generates a first signal at the first output terminal of the switch control circuitry 102 to initiate the first operational phase of the sampling circuitry 104. For example, the first signal can be a logic high value (e.g., a "1," 5 volts, etc.) that excites the control terminals of the first switch $112_A$, the first switch $112_B$, the fourth switch $126_A$, the fourth switch $126_B$, and the fifth switch 128. As such, the first signal at the first output terminal of the switch control circuitry 102 causes the first switch $112_A$, the first switch $112_B$, the fourth switch $126_A$, the fourth switch $126_B$, and the fifth switch 128 to be closed during the first operational phase of the sampling circuitry 104. In this manner, based on the rising edge of the clock signal, the switch control circuitry 102 generates the first signal to initiate the first operational phase of the sampling circuitry 104.

Additionally, in the example of FIG. 1, during the first operational phase of the sampling circuitry 104, the switch control circuitry 102 generates a second signal at the second output terminal of the switch control circuitry 102. For example, the second signal can be a logic low value (e.g., a "0," 0 volts, etc.) that does not excite the control terminals of the second switch $116_A$, the second switch $116_B$, and the third switch 124. As such, the second signal at the second output terminal of the switch control circuitry 102 causes the second switch $116_A$, the second switch $116_B$, and the third switch 124 to be open during the first operational phase of the sampling circuitry 104.

In the example of FIG. 1, based on a falling edge of the clock signal, the switch control circuitry 102 generates a second signal at the second output terminal of the switch control circuitry 102 to initiate the second operational phase of the sampling circuitry 104. For example, the second signal can be a logic high value (e.g., a "1," 5 volts, etc.) that excites the control terminals of the second switch $116_A$, the second switch $116_B$, and the third switch 124. As such, the second signal at the second output terminal of the switch control circuitry 102 causes the second switch $116_A$, the second switch $116_B$, and the third switch 124 to be closed during the second operational phase of the sampling circuitry 104. In this manner, based on the falling edge of the clock signal, the switch control circuitry 102 generates the second signal to initiate the second operational phase of the sampling circuitry 104.

Additionally, in the example of FIG. 1, during the second operational phase of the sampling circuitry 104, the switch control circuitry 102 generates a first signal at the first output terminal of the switch control circuitry 102. For example, the first signal can be a logic low value (e.g., a "0," 0 volts, etc.) that does not excite the control terminals of the first switch 112$_A$, the first switch 112$_B$, the fourth switch 126$_A$, the fourth switch 126$_B$, and the fifth switch 128. As such, the first signal at the first output terminal of the switch control circuitry 102 causes the first switch 112$_A$, the first switch 112$_B$, the fourth switch 126$_A$, the fourth switch 126$_B$, and the fifth switch 128 to be open during the second operational phase of the sampling circuitry 104.

In the illustrated example of FIG. 1, the switch control circuitry 102 reduces the likelihood that the switch control circuitry 102 will cause the sampling circuitry 104 to operate in the first operational phase and the second operational phase at the same time. For example, the inverters (e.g., the first NOT gate 136, the second NOT gate 138, the third NOT gate 140, the fourth NOT gate 142, the fifth NOT gate 146, the sixth NOT gate 148, and the seventh NOT gate 150) function as a delay line to ensure that one operational phase is not initiated (e.g., completely off plus a delay) before the next operational phase is initiated.

Figure 2:
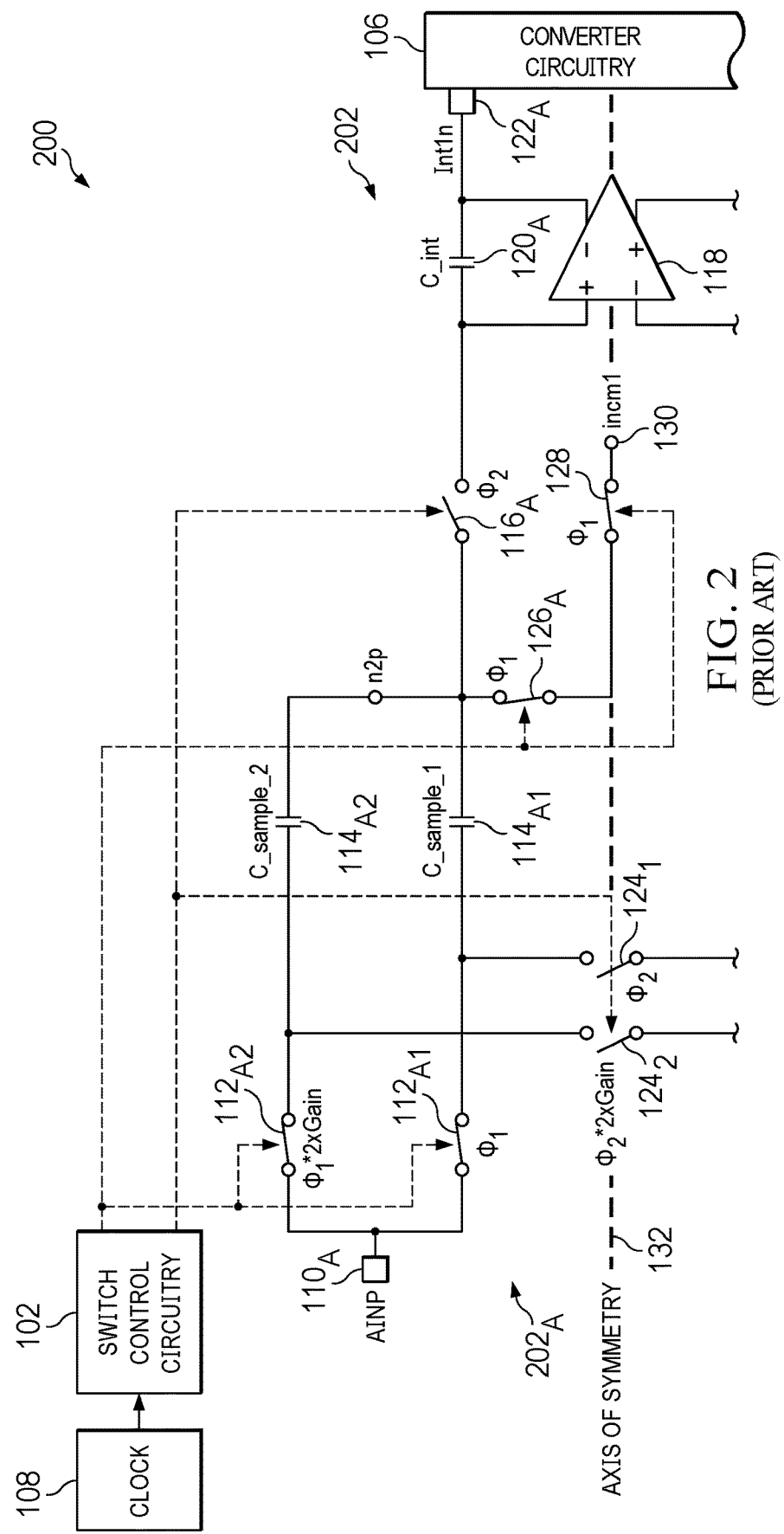
FIG. 2 illustrates a block diagram of an example ADC including multiple pairs of sampling capacitors.

In some examples, each of the positive sampling circuitry and the negative sampling circuitry of an ADC can include multiple sampling capacitor pairs. In such examples, the multiple sampling capacitor pairs sample an analog signal in the first operational phase and transfer the built-up charge to the integrating capacitors in the second operational phase. For example, FIG. 2 illustrates a block diagram of an example ADC 200 including multiple pairs of sampling capacitors. In the example of FIG. 2, the ADC 200 includes example sampling circuitry 202, the example switch control circuitry 102, the example converter circuitry 106, and the example clock 108.

In the illustrated example of FIG. 2, the sampling circuitry 202 includes example positive sampling circuitry 202$_A$ and example negative sampling circuitry 202$_B$ (not illustrated). The example positive sampling circuitry 202$_A$ includes the example positive analog input terminal 110$_A$, the first example switch 112$_A$, the example sampling capacitor 114$_A$, the second example switch 116$_A$, the example op-amp 118, the example integrating capacitor 120$_A$, the example negative integrated output terminal 122$_A$, the third example switch 124, the fourth example switch 126$_A$, the fifth example switch 128, and the example common mode voltage terminal 130. In the example of FIG. 2, the first example switch 112$_A$ is a first example sampling switch 112$_{A1}$. Additionally, in the example of FIG. 2, the example sampling capacitor 114$_A$ is a first example sampling capacitor 114$_{A1}$. Furthermore, in the example of FIG. 2, the third example switch 124 is a first example shorting control switch 124$_1$. In the example of FIG. 2, the example positive sampling circuitry 202$_A$ also includes a second example sampling switch 112$_{A2}$, a second example sampling capacitor 114$_{A2}$, and a second example shorting control switch 124$_2$.

In the illustrated example of FIG. 2, the sampling circuitry 202 is symmetrical across the example axis of symmetry 132. In the example of FIG. 2, the axis of symmetry 132 provides an axis of symmetry between the positive sampling circuitry 202$_A$ and the negative sampling circuitry 202$_B$ (not illustrated). For example, the negative sampling circuitry 202$_B$ (not illustrated) includes a first example sampling capacitor 114$_{B1}$ (not illustrated) implemented similarly to the first sampling capacitor 114$_{A1}$ of the positive sample circuitry 202$_A$. In the example of FIG. 2, the op-amp 118, the first shorting control switch 124$_1$, the second shorting control switch 124$_2$, the fifth switch 128, and the common mode voltage terminal 130 are positioned on the axis of symmetry 132 and are not replicated across the axis of symmetry 132.

In the illustrated example of FIG. 2, the example switch control circuitry 102, the example converter circuitry 106, the example clock 108, the example positive analog input terminal 110$_A$, the first example sampling switch 112$_{A1}$, the first example sampling capacitor 114$_{A1}$, the second example switch 116$_A$, the example op-amp 118, the example integrating capacitor 120$_A$, the example negative integrated output terminal 122$_A$, the first example shorting control switch 124$_1$, the fourth example switch 126$_A$, the fifth example switch 128, and the example common mode voltage terminal 130 are implemented similarly as described in connection with FIG. 1. For example, unless otherwise described, the example switch control circuitry 102, the example converter circuitry 106, the example clock 108, the example positive analog input terminal 110$_A$, the first example sampling switch 112$_{A1}$, the first example sampling capacitor 114$_{A1}$, the second example switch 116$_A$, the example op-amp 118, the example integrating capacitor 120$_A$, the example negative integrated output terminal 122$_A$, the first example shorting control switch 124$_1$, the fourth example switch 126$_A$, the fifth example switch 128, and the example common mode voltage terminal 130 are coupled to other components in the same manner as described in connection with FIG. 1.

In the illustrated example of FIG. 2, the positive sampling circuitry 202$_A$ is configured to have up to two times (e.g., 2×) gain. For example, a first terminal of the second sampling switch 112$_{A2}$ is coupled to the positive analog input terminal 110$_A$ and the first terminal of the first sampling switch 112$_{A1}$. Additionally, for example, a second terminal of the second sampling switch 112$_{A2}$ is coupled to a first terminal of the second sampling capacitor 114$_{A2}$ and a first terminal of the second shorting control switch 124$_2$. In the example of FIG. 2, a control terminal of the second sampling switch 112$_{A2}$ is coupled to the output terminal of the switch control circuitry 102. In the example of FIG. 2, a first terminal of the second sampling capacitor 114$_{A2}$ is coupled to the second terminal of the second sampling switch 112$_{A2}$ and the first terminal of the second shorting control switch 124$_2$. In the example of FIG. 2, a second terminal of the second sampling capacitor 114$_{A2}$ is coupled to the second terminal of the first sampling capacitor 114$_{A1}$, the first terminal of the second switch 116$_A$, and the first terminal of the fourth switch 126$_A$. In the example of FIG. 2, a first terminal of the second shorting control switch 124$_2$ is coupled to the second terminal of the second sampling switch 112$_{A2}$ and the first terminal of the second sampling capacitor 114$_{A2}$. In the example of FIG. 2, a second terminal of the second shorting control switch 124$_2$ is coupled to a second terminal of a second sampling switch 112$_{B2}$ (not illustrated) and a first terminal of a second sampling capacitor 114$_{B2}$ (not illustrated). In the example of FIG. 2, a control terminal of the second shorting control switch 124$_2$ is coupled to the second output terminal of the switch control circuitry 102.

In the illustrated example of FIG. 2, using two sampling capacitor pairs of the same capacitance and sampling the same input differential voltage would have the effect of passing twice the charge into the integrating capacitors during the second operational phase. As such, the input of the ADC 200 effectually has two times (e.g., 2×) gain. N sampling capacitor pairs can be implemented to have N times (e.g., N×) gain at the input of an ADC, depending on the configuration. The gain to the ADC 200 can be altered by modifying the switching logic that controls the first sampling switch $112_{A1}$ and the second sampling switch $112_{A2}$.

However, when an ADC is configured to have multiple gain conditions, but the maximum gain allowed by the sampling capacitor array is not utilized (e.g., the second sampling switch $112_{A2}$ is open during the first and second operational phases), the voltage at the input terminals of the unused sampling capacitors is floating in both the first operational phase and the second operational phase. As such, the voltage at the input terminals of the unused sampling capacitors is not controlled or defined. Over time, due to substrate coupling or other factors, the voltage at the input terminals of the unused sampling capacitors can drift to unknown values. Eventually, the voltage at the input terminals of the unused sampling capacitors can reach levels near the power supplies of the ADC. In such cases, significant leakage current can begin to flow through the sampling switches of unused sampling capacitors as compared to other states of operation of an ADC.

The susceptibility of sampling switches to leak current to the input terminals of unused sampling capacitors can be detrimental in the second operational phase, where the output terminals of the unused sampling capacitors are still coupled to the integrating capacitors. As such, an unintended current and/or charge transfer can occur during the second operational phase because of the floating voltage at the input terminals of the unused sampling capacitors. The unintended current and/or charge transfer can result in an erroneous charge input into the integrating capacitors. At slower clock rates, the leakage current can be particularly detrimental to expected operation as the leakage current has more time in the second operational phase to transfer charge. The effects of the leakage current are also exacerbated in devices operating at high temperatures as higher temperature situations are prone to have exponentially higher leakage current. Additionally, the effects of the leakage current are magnified when an ADC is configured to support a higher amount of gain as more input sampling switches are available to leak current. Even outside of slow clock rate, high ADC gain, or high temperature situations, the performance of a device can be impacted significantly. For example, a common-mode rejection ratio (CMRR) of an amplifier can be about 20 decibels (dB) less than expected. The degradation of the CMRR will vary based on the process used to manufacture an amplifier, operating temperature of the amplifier, bias voltage applied to the amplifier, input voltage to the amplifier, and/or other factors.

Figure 3:
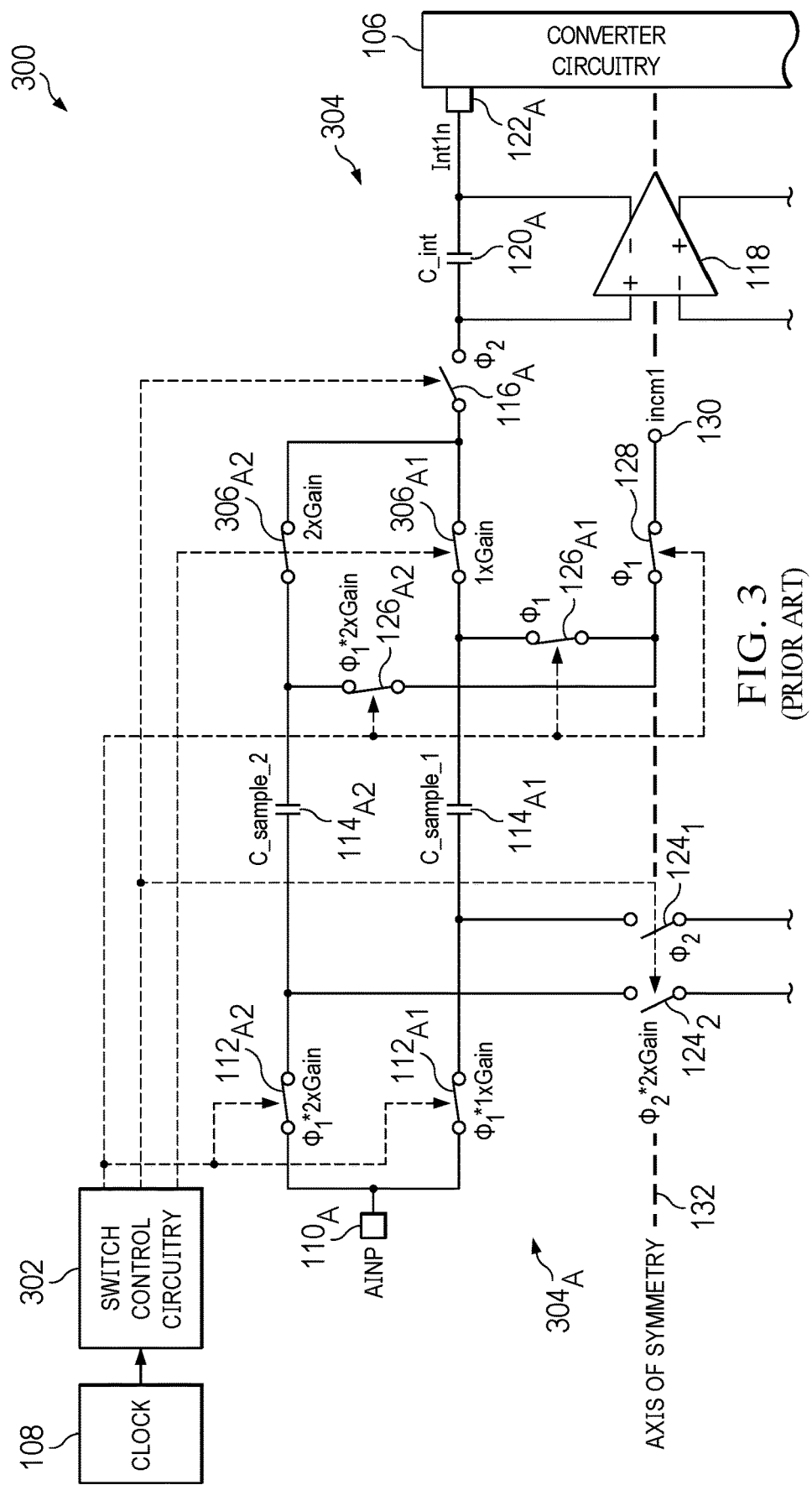
FIG. 3 is a block diagram of an example ADC including independent switches to isolate unused sampling capacitors during a first operational phase of example sampling circuitry.

FIG. 3 is a block diagram of an example ADC 300 including independent switches to isolate unused sampling capacitors during a first operational phase of example sampling circuitry. In the example of FIG. 3, the ADC 300 includes example switch control circuitry 302, example sampling circuitry 304, the example switch control circuitry 102, the example converter circuitry 106, and the example clock 108. In the example of FIG. 3, the sampling circuitry 304 includes example positive sampling circuitry $304_A$ and example negative sampling circuitry $304_B$ (not illustrated). The example positive sampling circuitry $304_A$ includes the example positive analog input terminal $110_A$, the first example sampling switch $112_{A1}$, the first example sampling capacitor $114_{A1}$, the second example sampling switch $112_{A2}$, the second example sampling capacitor $114_{A2}$, the second example switch $116_A$, the example op-amp 118, the example integrating capacitor $120_A$, the example negative integrated output terminal $122_A$, the first example shorting control switch $124_1$, the second example shorting control switch $124_2$, the fourth example switch $126_A$, the fifth example switch 128, and the example common mode voltage terminal 130. In the example of FIG. 3, the fourth example switch $126_A$ is a fourth example common coupling switch $126_{A1}$. In the example of FIG. 3, the example positive sampling circuitry $304_A$ also includes a fourth example common coupling switch $126_{A2}$, a first example isolation switch $306_{A1}$, and a second example isolation switch $306_{A2}$.

In the illustrated example of FIG. 3, the sampling circuitry 304 is symmetrical across the example axis of symmetry 132. In the example of FIG. 3, the axis of symmetry 132 provides an axis of symmetry between the positive sampling circuitry $304_A$ and the negative sampling circuitry $304_B$ (not illustrated). For example, the negative sampling circuitry $304_B$ (not illustrated) includes a first example sampling capacitor $114_{B1}$ (not illustrated) implemented similarly to the first sampling capacitor $114_{A1}$ of the positive sample circuitry $304_A$. In the example of FIG. 3, the op-amp 118, the first shorting control switch $124_1$, the second shorting control switch $124_2$, the fifth switch 128, and the common mode voltage terminal 130 are positioned on the axis of symmetry 132 and are not replicated across the axis of symmetry 132.

In the illustrated example of FIG. 3, the first terminal of the first sampling switch $112_{A1}$ is coupled to the positive analog input terminal $110_A$ and the first terminal of the second sampling switch $112_{A2}$. In the example of FIG. 3, a second terminal of the first sampling switch $112_{A1}$ is coupled to the first terminal of the first sampling capacitor $114_{A1}$ and the first terminal of the first shorting control switch $124_1$. In the example of FIG. 3, a control terminal of the first sampling switch $112_{A1}$ is coupled to a first output terminal of the switch control circuitry 302. In the example of FIG. 3, a first terminal of the first sampling capacitor $114_{A1}$ is coupled to the second terminal of the first sampling switch $112_{A1}$ and the first terminal of the first shorting control switch $124_1$. In the example of FIG. 3, a second terminal of the first sampling capacitor $114_{A1}$ is coupled to a first terminal of the first isolation switch $306_{A1}$ and a first terminal of the fourth common coupling switch $126_{A1}$. In the example of FIG. 3, the first terminal of the first isolation switch $306_{A1}$ is coupled to the second terminal of the first sampling capacitor $114_{A1}$ and the first terminal of the fourth common coupling switch $126_{A1}$. In the example of FIG. 3, the second terminal of the first isolation switch $306_{A1}$ is coupled to the first terminal of the second switch $116_A$ and a second terminal of the second isolation switch $306_{A2}$. In the example of FIG. 3, a control terminal of the first isolation switch $306_{A1}$ is coupled to a third output terminal of the switch control circuitry 302.

In the illustrated example of FIG. 3, the first terminal of the second sampling switch $112_{A2}$ is coupled to the positive analog input terminal $110_A$ and the first terminal of the first sampling switch $112_{A1}$. In the example of FIG. 3, a second terminal of the second sampling switch $112_{A2}$ is coupled to the first terminal of the second sampling capacitor $114_{A2}$ and the first terminal of the second shorting control switch $124_2$. In the example of FIG. 3, a control terminal of the second sampling switch $112_{A2}$ is coupled to the first output terminal of the switch control circuitry 302. In the example of FIG. 3, a first terminal of the second sampling capacitor $114_{A2}$ is coupled to the second terminal of the second sampling switch $112_{A2}$ and the first terminal of the second shorting control switch $124_2$. In the example of FIG. 3, a second terminal of the second sampling capacitor $114_{A2}$ is coupled to a first terminal of the second isolation switch $306_{A2}$ and a first terminal of the fourth common coupling switch $126_{A2}$. In the example of FIG. 3, the first terminal of the second isolation switch $306_{A2}$ is coupled to the second terminal of the second sampling capacitor $114_{A2}$ and the first terminal of the fourth common coupling switch $126_{A2}$. In the example of FIG. 3, the second terminal of the second isolation switch $306_{A2}$ is coupled to the first terminal of the second switch $116_A$ and the second terminal of the first isolation switch $306^{A1}$. In the example of FIG. 3, a control terminal of the second isolation switch $306_{A2}$ is coupled to the third output terminal of the switch control circuitry 302.

In the illustrated example of FIG. 3, the first terminal of the second switch $116_A$ is coupled to the second terminal of the first isolation switch $306_{A1}$ and the second terminal of the second isolation switch $306_{A2}$. In the example of FIG. 3, the second terminal of the second switch $116_A$ is coupled to the first terminal of the integrating capacitor $120_A$ and the non-inverting input terminal of the op-amp 118. In the example of FIG. 3, the control terminal of the second switch $116_A$ is coupled to a second output terminal of the switch control circuitry 302. In the example of FIG. 3, the non-inverting input terminal of the op-amp 118 is coupled to the second terminal of the second switch $116_A$ and the first terminal of the integrating capacitor $120_A$. In the example of FIG. 3, the example inverting output terminal of the op-amp 118 is coupled to the second terminal of the integrating capacitor $120_A$ and the negative integrated output terminal $122_A$. In the example of FIG. 3, the first terminal of the integrating capacitor $120_A$ is coupled to the second terminal of the second switch $116_A$ and the non-inverting input terminal of the op-amp 118. In the example of FIG. 3, the second terminal of the integrating capacitor $120_A$ is coupled to the negative integrated output terminal $122_A$ and the inverting output terminal of the op-amp 118. In the example of FIG. 3, the negative integrated output terminal $122_A$ is coupled to the second terminal of the integrating capacitor $120_A$, the inverting output terminal of the op-amp 118, and the converter circuitry 106.

In the illustrated example of FIG. 3, the first terminal of the first shorting control switch $124_1$ is coupled to the second terminal of the first sampling switch $112_{A1}$ and the first terminal of the first sampling capacitor $114_{A1}$. In the example of FIG. 3, a second terminal of the first shorting control switch $124_1$ is coupled to the second terminal of the first sampling switch $112_{B1}$ (not illustrated) and the first terminal of the first sampling capacitor $114_{B1}$ (not illustrated). In the example of FIG. 3, the control terminal of the first shorting control switch $124_1$ is coupled to the second output terminal of the switch control circuitry 302. In the example of FIG. 3, the first terminal of the second shorting control switch $124_2$ is coupled to the second terminal of the second sampling switch $112_{A2}$ and the first terminal of the second sampling capacitor $114_{A2}$. In the example of FIG. 3, a second terminal of the second shorting control switch $124_2$ is coupled to the second terminal of the second sampling switch $112_{B2}$ (not illustrated) and the first terminal of the second sampling capacitor $114_{B2}$ (not illustrated). In the example of FIG. 3, the control terminal of the second shorting control switch $124_2$ is coupled to the second output terminal of the switch control circuitry 302.

In the illustrated example of FIG. 1, the first terminal of the fourth common coupling switch $126_{A1}$ is coupled to the second terminal of the first sampling capacitor $114_{A1}$ and the first terminal of the first isolation switch $306_{A1}$. In the example of FIG. 3, the second terminal of the fourth common coupling switch $126_{A1}$ is coupled to the second terminal of the fourth common coupling switch $126_{A2}$, the first terminal of the fifth switch 128, the second terminal of a fourth example common coupling switch $126_{B1}$ (not illustrated), and a second terminal of a fourth example common coupling switch $126_{B2}$ (not illustrated). In the example of FIG. 2, the control terminal of the fourth common coupling switch $126_{A1}$ is coupled to the first output terminal of the switch control circuitry 302. In the example of FIG. 3, the first terminal of the fourth common coupling switch $126_{A2}$ is coupled to the second terminal of the second sampling capacitor $114_{A2}$ and the first terminal of the second isolation switch $306_{A2}$. In the example of FIG. 3, the second terminal of the fourth common coupling switch $126_{A2}$ is coupled to the second terminal of the fourth common coupling switch $126_{A1}$, the first terminal of the fifth switch 128, the second terminal of a fourth example common coupling switch $126_{B1}$ (not illustrated), and the second terminal of a fourth example common coupling switch $126_{B2}$ (not illustrated). In the example of FIG. 2, the control terminal of the fourth common coupling switch $126_{A2}$ is coupled to the first output terminal of the switch control circuitry 302. In the example of FIG. 3, the first terminal of the fifth switch 128 is coupled to the second terminal of the fourth common coupling switch $126_{A1}$, the second terminal of the fourth common coupling switch $126_{A2}$, the second terminal of the fourth common coupling switch $126_{B1}$, and the second terminal of the fourth common coupling switch $126_{B2}$. In the example of FIG. 3, the second terminal of the fifth switch 128 is coupled to the common mode voltage terminal 130. In the example of FIG. 3, the control terminal of the fifth switch 128 is coupled to the first output terminal of the switch control circuitry 102.

In the illustrated example of FIG. 3, the example converter circuitry 106 and the example clock 108 are implemented similarly as described in connection with FIGS. 1 and 2. For example, unless otherwise described, the example converter circuitry 106 and the example clock 108 are coupled to other components in the same manner as described in connection with FIGS. 1 and 2. In the example of FIG. 3, the switch control circuitry 302 is implemented similarly to the switch control circuitry 102 of FIGS. 1 and 2. Additionally, for example, the switch control circuitry 302 isolates unused sampling capacitors when a branch of the sampling capacitor array is not being used. For example, when the second sampling capacitor $114_{A2}$ is unused, the switch control circuitry 302 controls the second sampling switch $112_{A2}$ and the second isolation switch $306_{A2}$ to be open. As such, there is no connection between the output terminals of unused sampling capacitors and the integrating capacitor $120_A$. Thus, even if the voltage at the input terminals of unused sampling capacitors drifts, the risk of leakage current is reduced so long as the output terminals of unused sampling capacitors is disconnected from the integrating capacitor $120_A$.

However, leakage current can still occur in the sampling circuitry 304 of FIG. 3. For example, because the voltages at the input terminals and the output terminals of unused sampling capacitors are floating, the voltages can vary. If the voltage at both the input terminal and the output terminal of an unused sampling capacitor is close to the supply voltage of the ADC 300, then leakage current can occur. Additionally, the sampling circuitry 304 of FIG. 3 is not suitable for large sampling capacitor arrays (e.g., large gain conditions for and ADC). For example, the sampling circuitry 304 does not scale well for large gain conditions because the additional isolation switches complicate the layout and routing requirements of ICs implementing such circuitry. Additionally, because each sampling capacitor requires switches on both sides, the complexity of such circuitry is greatly increased (as compared to FIG. 2), leading to longer routed leads, and potentially lower capacitance density for a given layout area, depending on process constraints. Examples described herein avoid increased layout complexity while also mitigating leakage current occurring in unused sampling capacitors.

Figure 4:
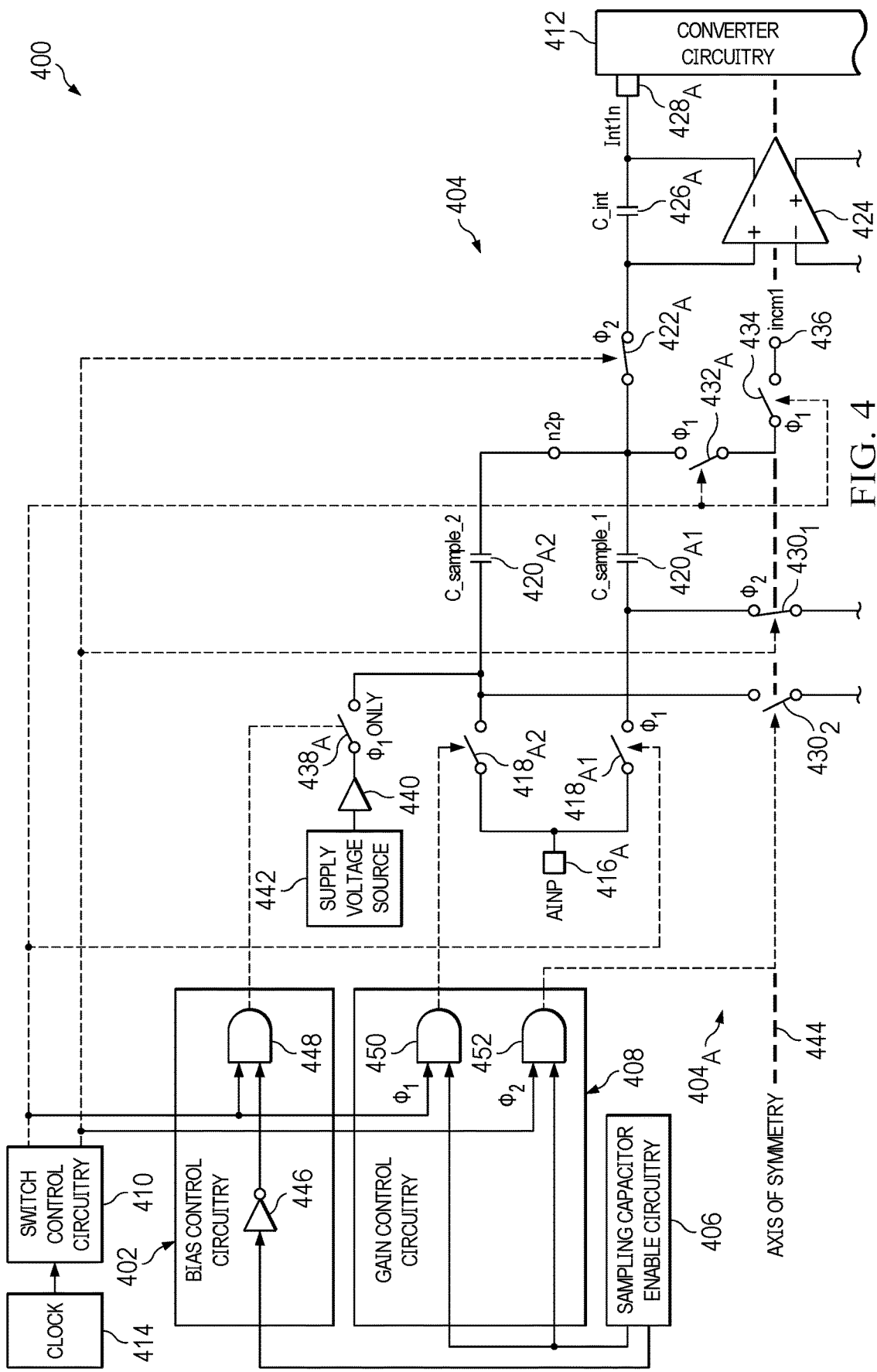
FIG. 4 is a block diagram of an ADC in which example bias control circuitry operates to bias unused sampling capacitors during a first operational phase of example sampling circuitry.

FIG. 4 is a block diagram of an ADC 400 in which example bias control circuitry 402 operates to bias unused sampling capacitors during a first operational phase of example sampling circuitry 404. In the example of FIG. 4, the ADC 400 includes the example bias control circuitry 402, the example sampling circuitry 404, example sampling capacitor enable circuitry 406, and example gain control circuitry 408. In the example of FIG. 4, the ADC 400 also includes example switch control circuitry 410, example converter circuitry 412, and an example clock 414.

In the illustrated example of FIG. 4, the sampling circuitry 404 includes example positive sampling circuitry $404_A$ and example negative sampling circuitry $404_B$ (not illustrated). The example positive sampling circuitry $404_A$ includes an example positive analog input terminal $416_A$, a first example sampling switch $418_{A1}$, a second example sampling switch $418_{A2}$, a first example sampling capacitor $420_{A1}$, a second example sampling capacitor $420_{A2}$, an example charge transfer switch $422_A$, an example op-amp 424, an example integrating capacitor $426_A$, an example negative integrated output terminal $428_A$, a first example shorting control switch $430_1$, a first example common coupling switch $432_A$, a second example common coupling switch 434, and an example common mode voltage terminal 436. In the example of FIG. 4, the example positive sampling circuitry $404_A$ also includes an example biasing switch $438_A$, an example buffer 440, and an example supply voltage source 442.

In the illustrated example of FIG. 4, the sampling circuitry 404 is symmetrical across the example axis of symmetry 444. In the example of FIG. 4, the axis of symmetry 444 provides an axis of symmetry between the positive sampling circuitry $404_A$ and the negative sampling circuitry $404_B$ (not illustrated). For example, the negative sampling circuitry $404_B$ (not illustrated) includes the first example sampling capacitor $420_{B1}$ (not illustrated) implemented similarly to the first example sampling capacitor $420_{A1}$ of the positive sample circuitry $404_A$. In the example of FIG. 4, the op-amp 424, the first shorting control switch $430_1$, the second shorting control switch $430_2$, the second common coupling switch 434, and the common mode voltage terminal 436 are positioned on the axis of symmetry 444 and are not replicated across the axis of symmetry 444. Additionally, the buffer 440 and the supply voltage source 442 may be utilized as described below with respect to replicated components of the negative sampling circuitry $404_B$ (not illustrated).

In the illustrated example of FIG. 4, the example switch control circuitry 410, the example converter circuitry 412, and the example clock 414 are implemented similarly to the example switch control circuitry 102, the example converter circuitry 106, and the example clock 108 of FIG. 2, respectively. For example, unless otherwise described, the example switch control circuitry 410, the example converter circuitry 412, and the example clock 414 are coupled to other components in the same manner as the example switch control circuitry 102, the example converter circuitry 106, and the example clock 108, respectively, described in connection with FIG. 2. Additionally, in the example of FIG. 2, the example positive analog input terminal $416_A$, the first example sampling switch $418_{A1}$, the second example sampling switch $418_{A2}$, the first example sampling capacitor $420_{A1}$, and the second example sampling capacitor $420_{A2}$ are implemented similarly to the example positive analog input terminal $110_A$, the first example sampling switch $112_{A1}$, the second example sampling switch $112_{A2}$, the first example sampling capacitor $114_{A1}$, and the second sampling capacitor $114_{A2}$ of FIG. 2, respectively. For example, unless otherwise described, the example positive analog input terminal $416_A$, the first example sampling switch $418_{A1}$, the second example sampling switch $418_{A2}$, the first example sampling capacitor $420_{A1}$, and the second example sampling capacitor $420_{A2}$ are coupled to other components in the same manner as the example positive analog input terminal $110_A$, the first example sampling switch $112_{A1}$, the second example sampling switch $112_{A2}$, the first example sampling capacitor $114_{A1}$, and the second sampling capacitor $114_{A2}$, respectively, described in connection with FIG. 2.

In the illustrated example of FIG. 4, the example charge transfer switch $422_A$, the example op-amp 424, the example integrating capacitor $426_A$, and the example negative integrated output terminal $428_A$ are implemented similarly to the second example switch $116_A$, the example op-amp 118, the example integrating capacitor $120_A$, and the example negative integrated output terminal $122_A$ of FIG. 2, respectively. For example, unless otherwise described, the example charge transfer switch $422_A$, the example op-amp 424, the example integrating capacitor $426_A$, and the example negative integrated output terminal $428_A$ are coupled to other components in the same manner as the second example switch $116_A$, the example op-amp 118, the example integrating capacitor $120_A$, and the example negative integrated output terminal $122_A$, respectively, described in connection with FIG. 2. In the example of FIG. 4, the first example shorting control switch $430_1$ and the second example shorting control switch $430_2$ are implemented similarly to the first example shorting control switch $124_1$ and the second example shorting control switch $124_2$ of FIG. 2, respectively. For example, unless otherwise described, the first example shorting control switch $430_1$ and the second example shorting control switch $430_2$ are coupled to other components in the same manner as the first example shorting control switch $124_1$ and the second example shorting control switch $124_2$, respectively, described in connection with FIG. 2.

In the illustrated example of FIG. 4, the first example common coupling switch $432_A$, the second example common coupling switch 434, and the example common mode voltage terminal 436 are implemented similarly to the fourth example switch $126_A$, the fifth example switch 128, and the example common mode voltage terminal 130 of FIG. 2, respectively. For example, unless otherwise described, the first example common coupling switch $432_A$, the second example common coupling switch 434, and the example common mode voltage terminal 436 are coupled to other components in the same manner as the fourth example switch $126_A$, the fifth example switch 128, and the example common mode voltage terminal 130, respectively, described in connection with FIG. 2.

In the illustrated example of FIG. 4, a first terminal of the biasing switch $438_A$ is coupled to an output terminal of the buffer 440. In the example of FIG. 4, the second terminal of the biasing switch $438_A$ is coupled to the second terminal of the second sampling switch $418_{A2}$, the first terminal of the second sampling capacitor $420_{A2}$, and the first terminal of the second shorting control switch $430_2$. In the example of FIG. 4, a control terminal of the biasing switch $438_A$ is coupled to an output terminal of the bias control circuitry 402.

In the illustrated example of FIG. 4, an input terminal of the buffer 440 is coupled to an output terminal (e.g., a supply terminal) of the supply voltage source 442. In the example of FIG. 4, the output terminal of the buffer 440 is coupled to the first terminal of the biasing switch $438_A$. In the example of FIG. 4, the buffer 440 is implemented by a voltage buffer. In some examples, the buffer 440 is implemented by a transmission gate. In the example of FIG. 4, the output terminal of the supply voltage source 442 is coupled to the input terminal of the buffer 440. In the example of FIG. 4, the supply voltage source 442 generates a voltage based on a supply voltage to the ADC 400. Additionally or alternatively, the supply voltage source 442 generates a voltage based on a supply voltage to the op-amp 424. In the example of FIG. 4, the supply voltage source 442 produces a voltage equal (e.g., a voltage equivalent) to the common mode voltage. In additional or alternative examples, the supply voltage source 442 produces a voltage at a predetermined level.

As described above, the buffer 440 and the supply voltage source 442 may be utilized as described below with respect to replicated components of the negative sampling circuitry $404_B$ (not illustrated). For example, the output terminal of the buffer 440 is also coupled to a first terminal of an example biasing switch $438_B$ (not illustrated). As such, when the biasing switch $438_A$ and the biasing switch $438_B$ (not illustrated) are closed, the first terminal of the second sampling capacitor $420_{A2}$ and the first terminal of the second sampling capacitor $420_{B2}$ (not illustrated) are biased to the same voltage (e.g., the voltage at the output terminal of the supply voltage source 442). Thus, there is no differential input between the first terminal of the second sampling capacitor $420_{A2}$ and the first terminal of the second sampling capacitor $420_{B2}$ (not illustrated).

In the illustrated example of FIG. 4, the bias control circuitry 402 includes an example NOT gate 446 and a first example AND gate 448. In the example of FIG. 4, an input terminal of the NOT gate 446 is coupled to an output terminal (e.g., an enable terminal) of the sampling capacitor enable circuitry 406. In the example of FIG. 4, an output terminal of the NOT gate 446 is coupled to a second input terminal of the first AND gate 448. As such, the NOT gate 446 produced an inverted value of an enable signal at the enable terminal (e.g., the output terminal of the sampling capacitor enable circuitry 406). In the example of FIG. 4, a first input terminal of the first AND gate 448 is coupled to the first output terminal of the switch control circuitry 410 (e.g., is coupled to switch control circuitry). In the example of FIG. 4, an output terminal of the first AND gate 448 is coupled to the control terminal of the biasing switch $438_A$. In this manner, the output terminal of the first AND gate 448 operates as the output terminal of the bias control circuitry 402.

In the illustrated example of FIG. 4, the output terminal of the sampling capacitor enable circuitry 406 is coupled to the input terminal of the NOT gate 446, a first input terminal of the gain control circuitry 408, and a fourth input terminal of the gain control circuitry 408. In the example of FIG. 4, the signal (e.g., an enable signal) at the output of the sampling capacitor enable circuitry 406 is generated based on a supply voltage to the ADC 400. Additionally or alternatively, the signal (e.g., an enable signal) at the output of the sampling capacitor enable circuitry 406 is generated based on a different supply voltage. In the example of FIG. 4, the sampling capacitor enable circuitry 406 produces a logic low value (e.g., a "0," 0 volts, etc.). In the example of FIG. 4, the gain control circuitry 408 includes a second example AND gate 450 and a third example AND gate 452. In the example of FIG. 4, a first input terminal of the second AND gate 450 is coupled to the first output terminal of the switch control circuitry 410. In this manner, the first input terminal of the second AND gate 450 operates as a second input terminal of the gain control circuitry 408. In the example of FIG. 4, a second input terminal of the second AND gate 450 is coupled to the output terminal of the sampling capacitor enable circuitry 406. In this manner, the second input terminal of the second AND gate 450 operates as the first input terminal of the gain control circuitry 408. In the example of FIG. 4, an output terminal of the second AND gate 450 is coupled to a control terminal of the second sampling switch $418_{A2}$. In this manner, the output terminal of the second AND gate 450 operates as a first output terminal of the gain control circuitry 408.

In the illustrated example of FIG. 4, a first input terminal of the third AND gate 452 is coupled to the second output terminal of the switch control circuitry 410. In this manner, the first input terminal of the third AND gate 452 operates as a third input terminal of the gain control circuitry 408. In the example of FIG. 4, a second input terminal of the third AND gate 452 is coupled to the output terminal of the sampling capacitor enable circuitry 406. In this manner, the second input terminal of the third AND gate 452 operates as the fourth input terminal of the gain control circuitry 408. In the example of FIG. 4, an output terminal of the third AND gate 452 is coupled to a control terminal of the second shorting control switch $430_2$. In this manner, the output terminal of the third AND gate 452 operates as a second output terminal of the gain control circuitry 408.

In the illustrated example of FIG. 4, during the first operational phase, the gain control circuitry 408 controls the second sampling switch $418_{A2}$ and the second shorting control switch $430_2$ to be open. As such, the second sampling capacitor $420_{A2}$ is unused during the first operational phase of the sampling circuitry 404. To prevent unintended leakage current from flowing through sampling switches of unused sampling capacitors, the bias control circuitry 402 selectively biases the input terminals of unused sampling capacitors to a known value during the first operational phase. For example, during the first operational phase, the bias control circuitry 402 controls the biasing switch $438_A$ to be closed. As such, the second sampling capacitor $420_{A2}$ (e.g., an unused sampling capacitor) is biased to the voltage at the supply terminal (e.g., the output terminal of the supply voltage source 442).

For example, the first terminal of the second sampling capacitor $420_{A2}$ is biased to the common mode voltage. During the first operational phase, the first common coupling switch $432_A$, the second common coupling switch 434 are closed which couples the second terminal of the second sampling capacitor $420_{A2}$ to the common mode voltage terminal 436. Thus, during the first operational phase, the first terminal of the second sampling capacitor $420_{A2}$ and the second terminal of the second sampling capacitor $420_{A2}$ are set the same voltage and there is no differential voltage across the second sampling capacitor $420_{A2}$. As such, charge build up in the second sampling capacitor $420_{A2}$ resulting from leakage current through the second sampling switch $418_{A2}$ is reduced.

In the illustrated example of FIG. 4, during the second operational phase, the gain control circuitry 408 controls sampling switches for unused sampling capacitors to be open instead of shorting the input terminal of the unused sampling capacitors together or reversing polarity of the input terminal of the sampling capacitors. For example, during the second operational phase, the gain control circuitry 408 controls the second sampling switch $418_{A2}$ and the second shorting control switch 430$_2$ to be open and the bias control circuitry 402 controls the biasing switch 438$_A$ to be open. As such, the voltage at the first terminal of the second sampling capacitor 420$_{A2}$ (e.g., an unused sampling capacitor) is floating. Accordingly, the op-amp 424 experiences little to no additional capacitive load (e.g., parasitic load) from the second sample capacitor 420$_{A2}$. The reduced load on the op-amp 424 reduces the power consumption of the sampling circuitry 404 and consequently reduces the overall power consumption of the ADC 400. As described herein, the input terminals of unused sampling capacitors are refreshed to a known value during every sampling phase of the sampling circuitry 404. As such, examples described herein ensure that the voltage at the input terminal of unused sampling capacitors does not reach values close to the supply voltage for the ADC 400 (e.g., voltage values where leakage current from the sampling switches is more prevalent).

Figure 5:
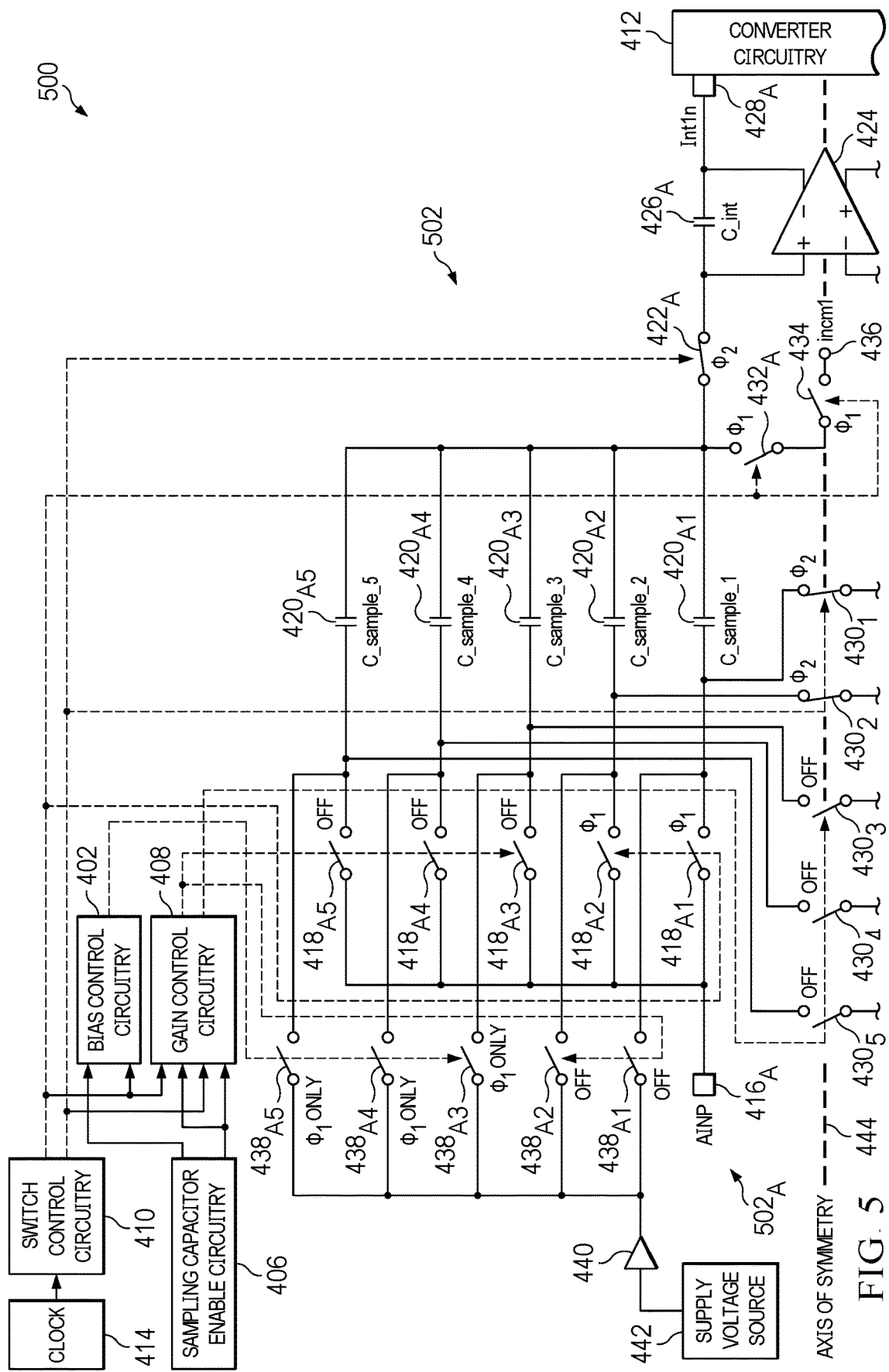
FIG. 5 is a block diagram of an example ADC in which example bias control circuitry operates to bias unused sampling capacitors during a first operational phase of example sampling circuitry.

FIG. 5 is a block diagram of an example ADC 500 in which the example bias control circuitry 402 operates to bias unused sampling capacitors during a first operational phase of example sampling circuitry 502. In the example of FIG. 5, the ADC 500 includes the example bias control circuitry 402, the example sampling capacitor enable circuitry 406, the example gain control circuitry 408, the example switch control circuitry 410, the example converter circuitry 412, the example clock 414, and the example sampling circuitry 502. In the example of FIG. 5, the sampling circuitry 502 includes example positive sampling circuitry 502$_A$ and example negative sampling circuitry 502$_B$ (not illustrated). The example positive sampling circuitry 502$_A$ includes the example positive analog input terminal 416$_A$, the first example sampling switch 418$_{A1}$, the second example sampling switch 418$_{A2}$, the first example sampling capacitor 420$_{A1}$, the second example sampling capacitor 420$_{A2}$, the example charge transfer switch 422$_A$, the example op-amp 424, the example integrating capacitor 426$_A$, the example negative integrated output terminal 428$_A$, the first example shorting control switch 430$_1$, the first example common coupling switch 432$_A$, the second example common coupling switch 434, and the example common mode voltage terminal 436.

In the illustrated example of FIG. 5, the example positive sampling circuitry 502$_A$ also includes a third example sampling switch 418$_{A3}$, a fourth example sampling switch 418$_{A4}$, and a fifth example sampling switch 418$_{A5}$. Additionally, in the example of FIG. 5, the example positive sampling circuitry 502$_A$ includes a third example sampling capacitor 420$_{A3}$, a fourth example sampling capacitor 420$_{A4}$, and a fifth example sampling capacitor 420$_{A5}$. Furthermore, the example positive sampling circuitry 502$_A$ includes a third example shorting control switch 430$_3$, a fourth example shorting control switch 430$_4$, and a fifth example shorting control switch 430$_5$. In the example of FIG. 5, the example positive sampling circuitry 502$_A$ includes a first example biasing switch 438$_{A1}$, a second example biasing switch 438$_{A2}$, a third example biasing switch 438$_{A3}$, a fourth example biasing switch 438$_{A4}$, and a fifth example biasing switch 438$_{A5}$. Additionally, the example positive sampling circuitry 502$_A$ includes the example buffer 440 and the example supply voltage source 442.

In the illustrated example of FIG. 5, the sampling circuitry 502 is symmetrical across the example axis of symmetry 444. In the example of FIG. 5, the axis of symmetry 444 provides an axis of symmetry between the positive sampling circuitry 502$_A$ and the negative sampling circuitry 502$_B$ (not illustrated). For example, the negative sampling circuitry 502$_B$ (not illustrated) includes the first example sampling capacitor 420$_{B1}$ (not illustrated) implemented similarly to the first example sampling capacitor 420$_{A1}$ of the positive sample circuitry 502$_A$. In the example of FIG. 5, the op-amp 424, the first shorting control switch 430$_1$, the second shorting control switch 430$_2$, the third shorting control switch 430$_3$, the fourth shorting control switch 430$_4$, the fifth shorting control switch 430$_5$, the second common coupling switch 434, and the common mode voltage terminal 436 are positioned on the axis of symmetry 444 and are not replicated across the axis of symmetry 444. Additionally, the buffer 440 and the supply voltage source 442 may be utilized as described below with respect to replicated components of the negative sampling circuitry 502$_B$ (not illustrated).

In the illustrated example of FIG. 5, the example bias control circuitry 402, the example sampling capacitor enable circuitry 406, the example gain control circuitry 408, the switch control circuitry 410, the converter circuitry 412, the clock 414, the example positive analog input terminal 416$_A$, the first example sampling switch 418$_{A1}$, the second example sampling switch 418$_{A2}$, the first example sampling capacitor 420$_{A1}$, the second example sampling capacitor 420$_{A2}$, the example charge transfer switch 422$_A$, the example op-amp 424, the example integrating capacitor 426$_A$, the example negative integrated output terminal 428$_A$, the first example shorting control switch 430$_1$, the second example shorting control switch 430$_2$, the first example common coupling switch 432$_A$, the second example common coupling switch 434, the example common mode voltage terminal 436, the buffer 440, and the supply voltage source 442 are implemented similarly as described in connection with FIG. 4. For example, unless otherwise described, the example bias control circuitry 402, the example sampling capacitor enable circuitry 406, the example gain control circuitry 408, the switch control circuitry 410, the converter circuitry 412, the clock 414, the example positive analog input terminal 416$_A$, the first example sampling switch 418$_{A1}$, the second example sampling switch 418$_{A2}$, the first example sampling capacitor 420$_{A1}$, the second example sampling capacitor 420$_{A2}$, the example charge transfer switch 422$_A$, the example op-amp 424, the example integrating capacitor 426$_A$, the example negative integrated output terminal 428$_A$, the first example shorting control switch 430$_1$, the second example shorting control switch 430$_2$, the first example common coupling switch 432$_A$, the second example common coupling switch 434, the example common mode voltage terminal 436, the buffer 440, and the supply voltage source 442 are coupled to other components in the same manner as described in connection with FIG. 4.

In the illustrated example of FIG. 5, the positive sampling circuitry 502$_A$ is configured to have up to five times (e.g., 5×) gain. For example, using five sampling capacitor pairs of the same capacitance and sampling the same input differential voltage would have the effect of passing five times the charge into the integrating capacitors during the second operational phase. As such, the input of the ADC 500 effectually has five times (e.g., 5×) gain. N sampling capacitor pairs can be implemented to have N times (e.g. N×) gain at the input of an ADC, depending on the configuration. The gain to the ADC 500 can be altered by modifying the switching logic that controls the first sampling switch 418$_{A1}$, the second sampling switch 418$_{A2}$, the third sampling switch 418$_{A3}$, the fourth sampling switch 418$_{A4}$, and/or the fifth sampling switch 418$_{A5}$. Additionally or alternatively, the gain of the ADC 500 can be altered by using sampling capacitor pairs with different capacitance values. In the example of FIG. 5, the first terminal of the first sampling switch $418_{A1}$ is coupled to the positive analog input terminal $416_A$, the first terminal of the second sampling switch $418_{A2}$, a first terminal of the third sampling switch $418_{A3}$, a first terminal of the fourth sampling switch $418_{A4}$, and a first terminal of the fifth sampling switch $418_{A5}$. In the example of FIG. 5, the second terminal of the first sampling switch $418_{A1}$ is coupled to the first terminal of the first shorting control switch $430_1$, the first terminal of the first sampling capacitor $420_{A1}$, and a second terminal of the first biasing switch $438_{A1}$. In the example of FIG. 5, the control terminal of the first sampling switch $418_{A1}$ is coupled to the first output terminal of the switch control circuitry 410.

In the illustrated example of FIG. 5, the first terminal of the first sampling capacitor $420_{A1}$ is coupled to the second terminal of the first sampling switch $418_{A1}$, the first terminal of the first shorting control switch $430_1$, and the second terminal of the first biasing switch $438_{A1}$. In the example of FIG. 5, the second terminal of the first sampling capacitor $420_{A1}$ is coupled to the first terminal of the charge transfer switch $422_A$, the first terminal of the first common coupling switch $432_A$, the second terminal of the second sampling capacitor $420_{A2}$, a second terminal of the third sampling capacitor $420_{A3}$, a second terminal of the fourth sampling capacitor $420_{A4}$, and a second terminal of the fifth sampling capacitor $420_{A5}$. As described above, the first common coupling switch $432_A$ is coupled to the second common coupling switch 434 and the second common coupling switch 434 is coupled to the common mode voltage terminal 436. As such, during the first operational phase, the first common coupling switch $432_A$ and the second common coupling switch 434 are closed. In this manner, the first sampling switch $418_{A1}$ and the first sampling capacitor $420_{A1}$ are coupled in series between an input voltage terminal (e.g., the positive analog input terminal $416_A$) and a common mode voltage terminal (e.g., the common mode voltage terminal 436).

In the illustrated example of FIG. 5, the first terminal of the first shorting control switch $430_1$ is coupled to the second terminal of the first sampling switch $418_{A1}$, the first terminal of the first sampling capacitor $420_{A1}$, and the second terminal of the first biasing switch $438_{A1}$. In the example of FIG. 5, a second terminal of the first shorting control switch $430_1$ is coupled to the second terminal of the first sampling switch $418_{B1}$ (not illustrated), the first terminal of the first sampling capacitor $420_{B1}$ (not illustrated), and a second terminal of a first example biasing switch $438_{B1}$ (not illustrated). In the example of FIG. 5, a control terminal of the first shorting control switch $430_1$ is coupled to the second output terminal of the switch control circuitry 102.

In the illustrated example of FIG. 5, a first terminal of the first biasing switch $438_{A1}$ is coupled to the output terminal of the buffer 440, a first terminal of the second biasing switch $438_{A2}$, a first terminal of the third biasing switch $438_{A3}$, a first terminal of the fourth biasing switch $438_{A4}$, and a first terminal of the fifth biasing switch $438_{A5}$. In the example of FIG. 5, the second terminal of the first biasing switch $438_{A1}$ is coupled to the second terminal of the first sampling switch $418_{A1}$, the first terminal of the first sampling capacitor $420_{A1}$, and the first terminal of the first shorting control switch $430_1$. In the example of FIG. 5, a control terminal of the first biasing switch $438_{A1}$ is coupled to the first output terminal of the gain control circuitry 408.

In the illustrated example of FIG. 5, the first terminal of the second sampling switch $418_{A2}$ is coupled to the positive analog input terminal $416_A$, the first terminal of the first sampling switch $418_{A1}$, the first terminal of the third sampling switch $418_{A3}$, the first terminal of the fourth sampling switch $418_{A4}$, and the first terminal of the fifth sampling switch $418_{A5}$. Additionally, the second terminal of the second sampling switch $418_{A2}$ is coupled to the first terminal of the second sampling capacitor $420_{A2}$, the first terminal of the second shorting control switch $430_2$, and a second terminal of the second biasing switch $438_{A2}$. In the example of FIG. 5, the control terminal of the second sampling switch $418_{A2}$ is coupled to the first output terminal of the switch control circuitry 410.

In the illustrated example of FIG. 5, the first terminal of the second sampling capacitor $420_{A2}$ is coupled to the second terminal of the second sampling switch $418_{A2}$, the first terminal of the second shorting control switch $430_2$, and the second terminal of the second biasing switch $438_{A2}$. In the example of FIG. 5, the second terminal of the second sampling capacitor $420_{A2}$ is coupled to the second terminal of the first sampling capacitor $420_{A1}$, the second terminal of the third sampling capacitor $420_{A3}$, the second terminal of the fourth sampling capacitor $420_{A4}$, the second terminal of the fifth sampling capacitor $420_{A5}$, the first terminal of the charge transfer switch $422_A$, and the first terminal of the first common coupling switch $432_A$. As described above, the first common coupling switch $432_A$ is coupled to the second common coupling switch 434 and the second common coupling switch 434 is coupled to the common mode voltage terminal 436. As such, during the first operational phase, the first common coupling switch $432_A$ and the second common coupling switch 434 are closed. In this manner, the second sampling switch $418_{A2}$ and the second sampling capacitor $420_{A2}$ are coupled in series between an input voltage terminal (e.g., the positive analog input terminal $416_A$) and a common mode voltage terminal (e.g., the common mode voltage terminal 436).

In the illustrated example of FIG. 5, the first terminal of the second shorting control switch $430_2$ is coupled to the second terminal of the second sampling switch $418_{A2}$, the first terminal of the second sampling capacitor $420_{A2}$, and the second terminal of the second biasing switch $438_{A2}$. In the example of FIG. 5, a second terminal of the second shorting control switch $430_2$ is coupled to a second terminal of a second example sampling switch $418_{B2}$ (not illustrated), a first terminal of a second sampling capacitor $420_{B2}$ (not illustrated), and a second terminal of a second example biasing switch $438_{B2}$ (not illustrated). In the example of FIG. 5, a control terminal of the second shorting control switch $430_2$ is coupled to the second output terminal of the switch control circuitry 102.

In the illustrated example of FIG. 5, a first terminal of the second biasing switch $438_{A2}$ is coupled to the output terminal of the buffer 440, the first terminal of the first biasing switch $438_{A1}$, the first terminal of the third biasing switch $438_{A3}$, the first terminal of the fourth biasing switch $438_{A4}$, and the first terminal of the fifth biasing switch $438_{A5}$. In the example of FIG. 5, the second terminal of the second biasing switch $438_{A2}$ is coupled to the second terminal of the second sampling switch $418_{A2}$, the first terminal of the second sampling capacitor $420_{A2}$, and the first terminal of the second shorting control switch $430_2$. In the example of FIG. 5, a control terminal of the second biasing switch $438_{A2}$ is coupled to the first output terminal of the gain control circuitry 408.

In the illustrated example of FIG. 5, a first terminal of the third sampling switch $418_{A3}$ is coupled to the positive analog input terminal $416_A$, the first terminal of the first sampling switch $418_{A1}$, the first terminal of the second sampling switch $418_{A2}$, the first terminal of the fourth sampling switch $418_{A4}$, and the first terminal of the fifth sampling switch $418_{A5}$. Additionally, for example, a second terminal of the third sampling switch $418_{A3}$ is coupled to a first terminal of the third sampling capacitor $420_{A3}$, a first terminal of the third shorting control switch $430_3$, and a second terminal of the third biasing switch $438_{A3}$. In the example of FIG. 5, a control terminal of the third sampling switch $418_{A3}$ is coupled to the first output terminal of the gain control circuitry 408.

In the illustrated example of FIG. 5, a first terminal of the third sampling capacitor $420_{A3}$ is coupled to the second terminal of the third sampling switch $418_{A3}$, the first terminal of the third shorting control switch $430_3$, and the second terminal of the third biasing switch $438_{A3}$. In the example of FIG. 5, a second terminal of the third sampling capacitor $420_{A3}$ is coupled to the second terminal of the first sampling capacitor $420_{A1}$, the second terminal of the second sampling capacitor $420_{A2}$, the second terminal of the fourth sampling capacitor $420_{A4}$, the second terminal of the fifth sampling capacitor $420_{A5}$, the first terminal of the charge transfer switch $422_A$, and the first terminal of the first common coupling switch $432_A$. As described above, the first common coupling switch $432_A$ is coupled to the second common coupling switch 434 and the second common coupling switch 434 is coupled to the common mode voltage terminal 436. As such, during the first operational phase, the first common coupling switch $432_A$ and the second common coupling switch 434 are closed. In this manner, the third sampling switch $418_{A3}$ and the third sampling capacitor $420_{A3}$ are coupled in series between an input voltage terminal (e.g., the positive analog input terminal $416_A$) and a common mode voltage terminal (e.g., the common mode voltage terminal 436).

In the illustrated example of FIG. 5, the first terminal of the third shorting control switch $430_3$ is coupled to the second terminal of the third sampling switch $418_{A3}$, the first terminal of the third sampling capacitor $420_{A3}$, and the second terminal of the third biasing switch $438_{A3}$. In the example of FIG. 5, a second terminal of the third shorting control switch $430_3$ is coupled to a second terminal of a third example sampling switch $418_{B3}$ (not illustrated), a first terminal of a third sampling capacitor $420_{B3}$ (not illustrated), and a second terminal of a third example biasing switch $438_{B3}$ (not illustrated). In the example of FIG. 5, a control terminal of the third shorting control switch $430_3$ is coupled to the second output terminal of the gain control circuitry 408.

In the illustrated example of FIG. 5, a first terminal of the third biasing switch $438_{A3}$ is coupled to the output terminal of the buffer 440, the first terminal of the first biasing switch $438_{A1}$, the first terminal of the second biasing switch $438_{A2}$, the first terminal of the fourth biasing switch $438_{A4}$, and the first terminal of the fifth biasing switch $438_{A5}$. In the example of FIG. 5, the second terminal of the third biasing switch $438_{A3}$ is coupled to the second terminal of the third sampling switch $418_{A3}$, the first terminal of the third sampling capacitor $420_{A3}$, and the first terminal of the third shorting control switch $430_3$. In the example of FIG. 5, a control terminal of the third biasing switch $438_{A3}$ is coupled to the output terminal of the bias control circuitry 402.

In the illustrated example of FIG. 5, a first terminal of the fourth sampling switch $418_{A4}$ is coupled to the positive analog input terminal $416_A$, the first terminal of the first sampling switch $418_{A1}$, the first terminal of the second sampling switch $418_{A2}$, the first terminal of the third sampling switch $418_{A3}$, and the first terminal of the fifth sampling switch $418_{A5}$. Additionally, for example, a second terminal of the fourth sampling switch $418_{A4}$ is coupled to a first terminal of the fourth sampling capacitor $420_{A4}$, a first terminal of the fourth shorting control switch $430_4$, and a second terminal of the fourth biasing switch $438_{A4}$. In the example of FIG. 5, a control terminal of the fourth sampling switch $418_{A4}$ is coupled to the first output terminal of the gain control circuitry 408.

In the illustrated example of FIG. 5, a first terminal of the fourth sampling capacitor $420_{A4}$ is coupled to the second terminal of the fourth sampling switch $418_{A4}$, the first terminal of the fourth shorting control switch $430_4$, and the second terminal of the fourth biasing switch $438_{A4}$. In the example of FIG. 5, a second terminal of the fourth sampling capacitor $420_{A4}$ is coupled to the second terminal of the first sampling capacitor $420_{A1}$, the second terminal of the second sampling capacitor $420_{A2}$, the second terminal of the third sampling capacitor $420_{A3}$, the second terminal of the fifth sampling capacitor $420_{A5}$, the first terminal of the charge transfer switch $422_A$, and the first terminal of the first common coupling switch $432_A$. As described above, the first common coupling switch $432_A$ is coupled to the second common coupling switch 434 and the second common coupling switch 434 is coupled to the common mode voltage terminal 436. As such, during the first operational phase, the first common coupling switch $432_A$ and the second common coupling switch 434 are closed. In this manner, the fourth sampling switch $418_{A4}$ and the fourth sampling capacitor $420_{A4}$ are coupled in series between an input voltage terminal (e.g., the positive analog input terminal $416_A$) and a common mode voltage terminal (e.g., the common mode voltage terminal 436).

In the illustrated example of FIG. 5, the first terminal of the fourth shorting control switch $430_4$ is coupled to the second terminal of the fourth sampling switch $418_{A4}$, the first terminal of the fourth sampling capacitor $420_{A4}$, and the second terminal of the fourth biasing switch $438_{A4}$. In the example of FIG. 5, a second terminal of the fourth shorting control switch $430_4$ is coupled to a second terminal of a fourth example sampling switch $418_{B4}$ (not illustrated), a first terminal of a fourth sampling capacitor $420_{B4}$ (not illustrated), and a second terminal of a fourth example biasing switch $438_{B4}$ (not illustrated). In the example of FIG. 5, a control terminal of the fourth shorting control switch $430_4$ is coupled to the second output terminal of the gain control circuitry 408.

In the illustrated example of FIG. 5, a first terminal of the fourth biasing switch $438_{A4}$ is coupled to the output terminal of the buffer 440), the first terminal of the first biasing switch $438_{A1}$, the first terminal of the second biasing switch $438_{A2}$, the first terminal of the third biasing switch $438_{A3}$, and the first terminal of the fifth biasing switch $438_{A5}$. In the example of FIG. 5, the second terminal of the fourth biasing switch $438_{A4}$ is coupled to the second terminal of the fourth sampling switch $418_{A4}$, the first terminal of the fourth sampling capacitor $420_{A4}$, and the first terminal of the fourth shorting control switch $430_4$. In the example of FIG. 5, a control terminal of the fourth biasing switch $438_{A4}$ is coupled to the output terminal of the bias control circuitry 402.

In the illustrated example of FIG. 5, a first terminal of the fifth sampling switch $418_{A5}$ is coupled to the positive analog input terminal $416_A$, the first terminal of the first sampling switch $418_{A1}$, the first terminal of the second sampling switch $418_{A2}$, the first terminal of the third sampling switch $418_{A3}$, and the first terminal of the fourth sampling switch $418_{A4}$. Additionally, for example, a second terminal of the fifth sampling switch $418_{A5}$ is coupled to a first terminal of the fifth sampling capacitor $420_{A5}$, a first terminal of the fifth shorting control switch $430_5$, and a second terminal of the fifth biasing switch $438_{A5}$. In the example of FIG. 5, a control terminal of the fifth sampling switch $418_{A5}$ is coupled to the first output terminal of the gain control circuitry 408.

In the illustrated example of FIG. 5, a first terminal of the fifth sampling capacitor $420_{A5}$ is coupled to the second terminal of the fifth sampling switch $418_{A5}$, the first terminal of the fifth shorting control switch $430_5$, and the second terminal of the fifth biasing switch $438_{A5}$. In the example of FIG. 5, a second terminal of the fifth sampling capacitor $420_{A5}$ is coupled to the second terminal of the first sampling capacitor $420_{A1}$, the second terminal of the second sampling capacitor $420_{A2}$, the second terminal of the third sampling capacitor $420_{A3}$, the second terminal of the fourth sampling capacitor $420_{A4}$, the first terminal of the charge transfer switch $422_A$, and the first terminal of the first common coupling switch $432_A$. As described above, the first common coupling switch $432_A$ is coupled to the second common coupling switch 434 and the second common coupling switch 434 is coupled to the common mode voltage terminal 436. As such, during the first operational phase, the first common coupling switch $432_A$ and the second common coupling switch 434 are closed. In this manner, the fifth sampling switch $418_{A5}$ and the fifth sampling capacitor $420_{A5}$ are coupled in series between an input voltage terminal (e.g., the positive analog input terminal $416_A$) and a common mode voltage terminal (e.g., the common mode voltage terminal 436).

In the illustrated example of FIG. 5, the first terminal of the fifth shorting control switch $430_5$ is coupled to the second terminal of the fifth sampling switch $418_{A5}$, the first terminal of the fifth sampling capacitor $420_{A5}$, and the second terminal of the fifth biasing switch $438_{A5}$. In the example of FIG. 5, a second terminal of the fifth shorting control switch $430_5$ is coupled to a second terminal of a fifth example sampling switch $418_{B5}$ (not illustrated), a first terminal of a fifth sampling capacitor $420_{B5}$ (not illustrated), and a second terminal of a fifth example biasing switch $438_{B5}$ (not illustrated). In the example of FIG. 5, a control terminal of the fifth shorting control switch $430_5$ is coupled to the second output terminal of the gain control circuitry 408.

In the illustrated example of FIG. 5, a first terminal of the fifth biasing switch $438_{A5}$ is coupled to the output terminal of the buffer 440, the first terminal of the first biasing switch $438_{A1}$, the first terminal of the second biasing switch $438_{A2}$, the first terminal of the third biasing switch $438_{A3}$, and the first terminal of the fourth biasing switch $438_{A4}$. In the example of FIG. 5, the second terminal of the fifth biasing switch $438_{A5}$ is coupled to the second terminal of the fifth sampling switch $418_{A5}$, the first terminal of the fifth sampling capacitor $420_{A5}$, and the first terminal of the fifth shorting control switch $430_5$. In the example of FIG. 5, a control terminal of the fifth biasing switch $438_{A5}$ is coupled to the output terminal of the bias control circuitry 402.

As illustrated in FIG. 5, examples described herein scale well without overly complicating layout. For example, examples described herein utilize two additional switches (e.g., a biasing switch and a shorting control switch) per branch of the sampling capacitor array as compared to the three additional switches required per branch by the approach illustrated in FIG. 3.

In examples described herein, one or more of the switches described herein can be implemented by an electronic switch. For example, one or more of the switches described herein can be implemented by a field-effect transistor (FET) such as a metal-oxide-semiconductor field-effect transistor (MOSFET), a bipolar transistor such as a bipolar junction transistor (BJT), and/or an insulated-gate bipolar transistor (IGBT). Additionally or alternatively, one or more of the switches described herein can be implemented by a junction field-effect transistor (JFET).

Figure 6:
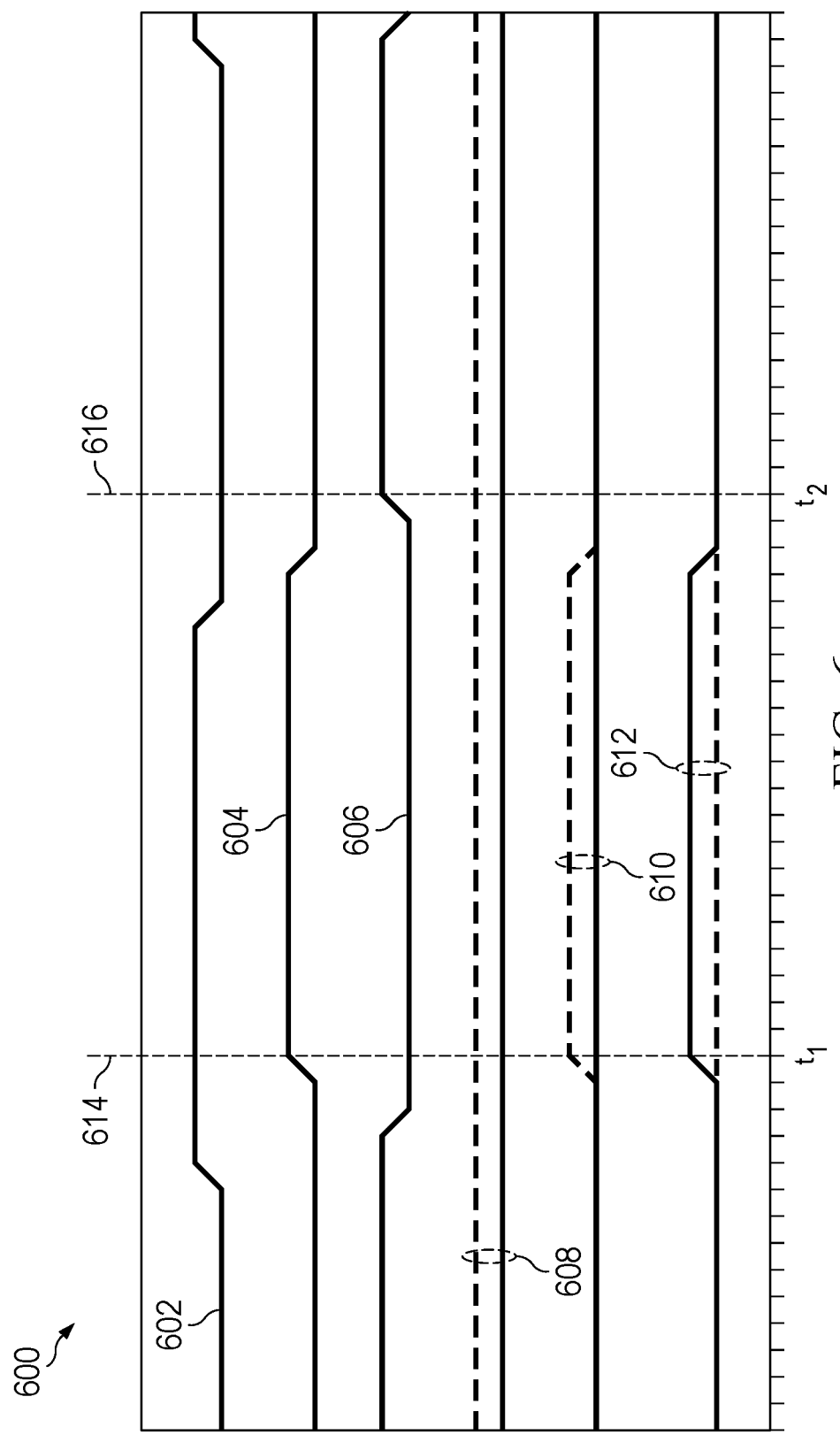
FIG. 6 is an example timing diagram illustrating example operation of the example sampling circuitry of FIG. 4.

FIG. 6 is an example timing diagram 600 illustrating example operation of the example sampling circuitry 404 of FIG. 4. The timing diagram 600 includes a first example plot 602, a second example plot 604, a third example plot 606, a fourth example plot 608, a fifth example plot 610, and a sixth example plot 612. In the example of FIG. 6, the first plot 602 illustrates a clock signal generated by the clock 414. In the example of FIG. 6, the second plot 604 illustrates the signal generated by the switch control circuitry 410 at the first output terminal of the switch control circuitry 410. The third example plot 606 illustrates the signal generated by the switch control circuitry 410 at the second output terminal of the switch control circuitry 410.

In the illustrated example of FIG. 6, the fourth plot 608 illustrates two signals depicting different states of the signal at the output terminal of the sampling capacitor enable circuitry 406. For example, the dashed line illustrates when the value of the signal at the output terminal of the sampling capacitor enable circuitry 406 is a logic high value. Additionally, the solid line illustrates when the value of the signal at the output terminal of the sampling capacitor enable circuitry 406 is a logic low value.

In the illustrated example of FIG. 6, the fifth plot 610 illustrates two signals depicting different states of the signal the first output terminal of the gain control circuitry 408. For example, the dashed line illustrates the value of the signal at the first output terminal of the gain control circuitry 408 when the value of the signal at the output terminal of the sampling capacitor enable circuitry 406 is a logic high value. Additionally, the solid line illustrates the value of the signal at the first output terminal of the gain control circuitry 408 when the value of the signal at the output terminal of the sampling capacitor enable circuitry 406 is a logic low value.

In the illustrated example of FIG. 6, the sixth plot 612 illustrates two signals depicting different states of the signal the output terminal of the bias control circuitry 402. For example, the dashed line illustrates the value of the signal at the output terminal of the bias control circuitry 402 when the value of the signal at the output terminal of the sampling capacitor enable circuitry 406 is a logic high value. Additionally, the solid line illustrates the value of the signal at the output terminal of the bias control circuitry 402 when the value of the signal at the output terminal of the sampling capacitor enable circuitry 406 is a logic low value.

In the illustrated example of FIG. 6, a first example time 614, $t_1$, represents a start time of the first operational phase of the sampling circuitry 404. At the first time 614, $t_1$, the value of the clock signal at the output of the clock 414 is a logic high value. As such, the value of the signal at the first output terminal of the switch control circuitry 410 is a logic high value and the value of the signal at the second output terminal of the switch control circuitry 410 is a logic low value. At the first time 614, $t_1$, when the value of the signal at the output terminal of the sampling capacitor enable circuitry 406 is a logic high value, the value at the first output terminal of the gain control circuitry 408 is a logic high value. Additionally, at the first time 614, $t_1$, when the value of the signal at the output terminal of the sampling capacitor enable circuitry 406 is a logic high value, the value at the output terminal of the bias control circuitry 402 is a logic low value. As such, when the value of the signal at the output terminal of the sampling capacitor enable circuitry 406 is a logic high value, the biasing switch 438$_A$ is open and the second sampling switch 418$_{A2}$ is closed during the first operational phase of the sampling circuitry 404. As such, when the value of the signal at the output terminal of the sampling capacitor enable circuitry 406 is a logic high value, the second sampling capacitor 420$_{A2}$ samples the voltage at the positive analog input terminal 416$_A$ during the first operational phase of the sampling circuitry 404.

Alternatively, when the value of the signal at the output terminal of the sampling capacitor enable circuitry 406 is a logic low value at the first time 614, t$_1$, the value at the first output terminal of the gain control circuitry 408 is a logic low value. Additionally, at the first time 614, t$_1$, when the value of the signal at the output terminal of the sampling capacitor enable circuitry 406 is a logic low value, the value at the output terminal of the bias control circuitry 402 is a logic high value. As such, when the value of the signal at the output terminal of the sampling capacitor enable circuitry 406 is a logic low value, the biasing switch 438$_A$ is closed and the second sampling switch 418$_{A2}$ is open during the first operational phase of the sampling circuitry 404. As such, when the value of the signal at the output terminal of the sampling capacitor enable circuitry 406 is a logic low value, the first terminal of the second sampling capacitor 420$_{A2}$ is biased to the voltage at the supply terminal (e.g., the voltage at the output terminal of the supply voltage source 442).

In the illustrated example of FIG. 6, a second example time 616, t$_2$, represents a start time of the second operational phase of the sampling circuitry 404. At the second time 616, t$_2$, the value of the clock signal at the output of the clock 414 is a logic low value. As such, the value of the signal at the first output terminal of the switch control circuitry 410 is a logic low value and the value of the signal at the second output terminal of the switch control circuitry 410 is a logic high value. At the second time 616, t$_2$, when the value of the signal at the output terminal of the sampling capacitor enable circuitry 406 is a logic low value, the value at the first output terminal of the gain control circuitry 408 is a logic low value. Additionally, at the second time 616, t$_2$, when the value of the signal at the output terminal of the sampling capacitor enable circuitry 406 is a logic low value, the value at the output terminal of the bias control circuitry 402 is a logic low value. As such, when the value of the signal at the output terminal of the sampling capacitor enable circuitry 406 is a logic low value, the biasing switch 438$_A$ is open and the second sampling switch 418$_{A2}$ is open during the second operational phase of the sampling circuitry 404. As such, when the value of the signal at the output terminal of the sampling capacitor enable circuitry 406 is a logic low value, the voltage at the first terminal of the second sampling capacitor 420$_{A2}$ is floating which reduces the capacitive load on the op-amp 424 during the second operational phase of the sampling circuitry 404. The bias control circuitry 402 and the gain control circuitry 408 operate similarly when the value of the signal at the output terminal of the sampling capacitor enable circuitry 406 is a logic high value at the second time 616, t$_2$.

Figure 7:
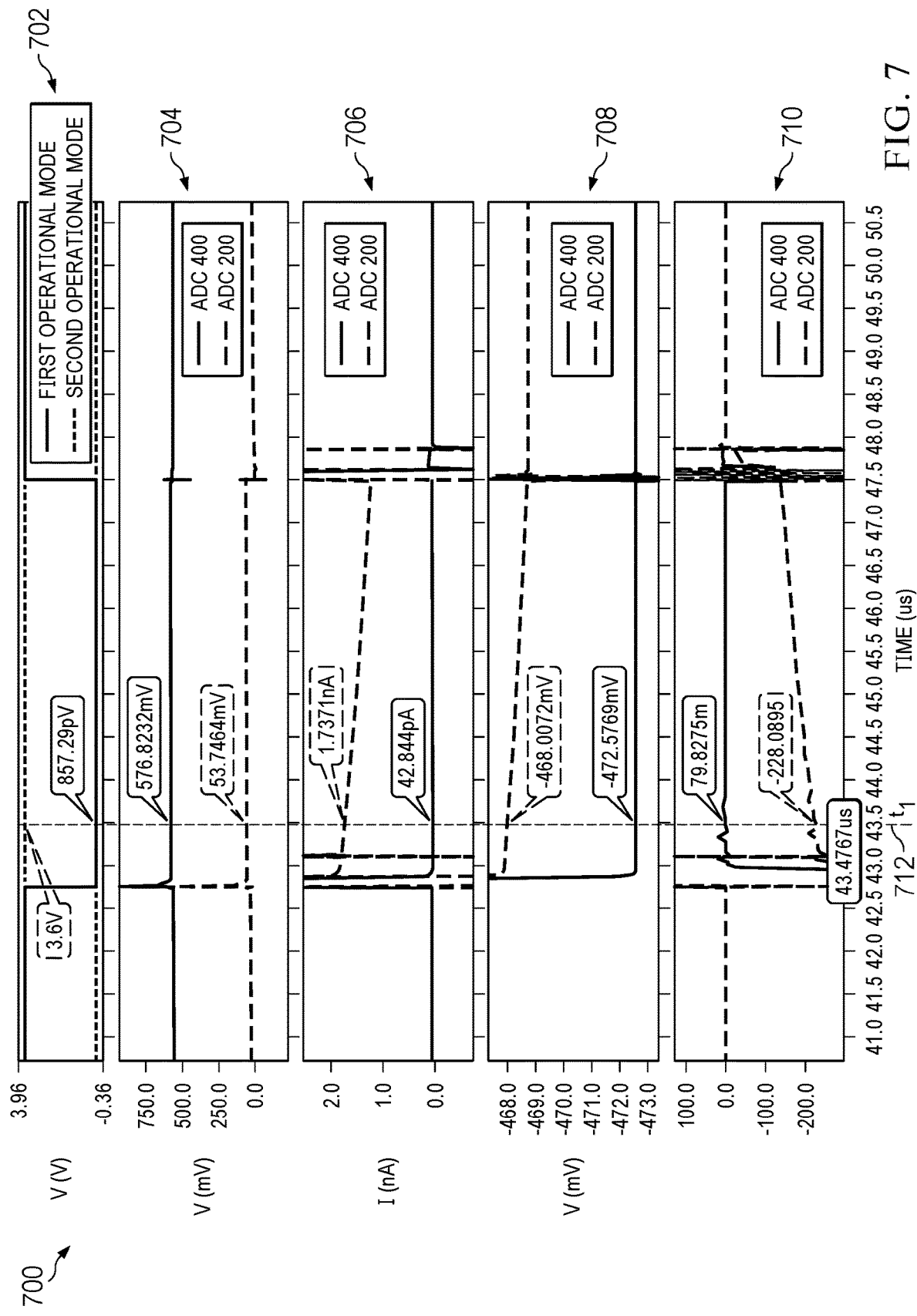
FIG. 7 is an example timing diagram illustrating example improvements achieved by examples described herein.

FIG. 7 is an example timing diagram 700 illustrating example improvements achieved by examples described herein. The timing diagram 700 includes a first example plot 702, a second example plot 704, a third example plot 706, a fourth example plot 708, and a fifth example plot 710. In the example of FIG. 7, the first plot 702 illustrates signals to initiate the first operational phase and the second operational phase. For example, a signal to initiate the first operational mode is illustrated as a solid line and a signal to initiate the second operational mode is illustrated as a dashed line.

In the illustrated example of FIG. 7, the second plot 704 illustrates the voltage at the input terminal of an unused sampling capacitor. In the second example plot 704, the solid line represents the voltage at the first terminal of the second sampling capacitor 420$_{A2}$ when the second sampling capacitor 420$_{A2}$ is unused (e.g., the second sampling switch 418$_{A2}$ is open during the first operational phase). Additionally, in the second example plot 704, the dashed line represents the voltage at the first terminal of the second sampling capacitor 114$_{A2}$ of FIG. 2 when the second sampling capacitor 114$_{A2}$ is unused (e.g., the second sampling switch 112$_{A2}$ is open during the first operational phase).

In the illustrated example of FIG. 7, the third plot 706 illustrates the current flowing through the unused sampling capacitor. In the third example plot 706, the solid line represents the current flowing through the second sampling capacitor 420$_{A2}$ when the second sampling capacitor 420$_{A2}$ is unused (e.g., the second sampling switch 418$_{A2}$ is open during the first operational phase). Additionally, in the third example plot 706, the dashed line represents the current flowing through the second sampling capacitor 114$_{A2}$ of FIG. 2 when the second sampling capacitor 114$_{A2}$ is unused (e.g., the second sampling switch 112$_{A2}$ is open during the first operational phase).

In the illustrated example of FIG. 7, the fourth plot 708 illustrates the voltage measured between the differential output of sampling circuitry including unused sampling capacitors. In the fourth example plot 708, the solid line represents the voltage measured between the negative integrated output terminal 428$_A$ and an example positive integrated output terminal 428$_B$ of FIG. 4 (not illustrated) when the second sampling capacitor 420$_{A2}$ is unused (e.g., the second sampling switch 418$_{A2}$ is open during the first operational phase). Additionally, in the fourth example plot 708, the dashed line represents the voltage measured between the negative integrated output terminal 122$_A$ and the positive integrated output terminal 122$_B$ of FIG. 2 (not illustrated) when the second sampling capacitor 114$_{A2}$ is unused (e.g., the second sampling switch 112$_{A2}$ is open during the first operational phase).

In the illustrated example of FIG. 7, the fifth plot 710 illustrates the differential of the signals illustrated in the fourth plot 708. In the fifth example plot 710, the solid line represents the derivative of the voltage measured between the negative integrated output terminal 428$_A$ and an example positive integrated output terminal 428$_B$ of FIG. 4 (not illustrated) with respect to time when the second sampling capacitor 420$_{A2}$ is unused (e.g., the second sampling switch 418$_{A2}$ is open during the first operational phase). Additionally, in the fifth example plot 710, the dashed line represents the derivative of the voltage measured between the negative integrated output terminal 122$_A$ and the positive integrated output terminal 122$_B$ of FIG. 2 (not illustrated) with respect to time when the second sampling capacitor 114$_{A2}$ is unused (e.g., the second sampling switch 112$_{A2}$ is open during the first operational phase).

In the illustrated example of FIG. 7, a first example time 712, t$_1$, represents a time during the second operational phase of the sampling circuitry 202 of FIG. 2 and the second operational phase of the sampling circuitry 404. At the first time 712, t$_1$, the voltage at the first terminal of the second sampling capacitor 420$_{A2}$ is set (e.g., reset) to about 577 millivolts (mV) (e.g., the voltage at the supply terminal). Additionally, at the first time 712, t$_1$, the voltage at the first terminal of the second sampling capacitor 114$_{A2}$ of FIG. 2 is drawn to about 54 mV by leakage current flowing through the second sampling capacitor $114_{A2}$ of FIG. 2.

In the illustrated example of FIG. 7, at the first time 712, $t_1$, there is almost no current (e.g., about 43 picoamps (pA)) flowing through the second sampling capacitor $420_{A2}$ whereas a non-negligible amount of current (e.g., about 1.74 nanoamps (nA)) flowing through the second sampling capacitor $114_{A2}$ of FIG. 2. The amount of current flowing through the second sampling capacitor $114_{A2}$ of FIG. 2 is dependent on the voltage at the first terminal of the second sampling capacitor $114_{A2}$ of FIG. 2. As described above, the voltage at the first terminal of the second sampling capacitor $114_{A2}$ of FIG. 2 is undefined and can vary. As such, the amount of current flowing through the second sampling capacitor $114_{A2}$ of FIG. 2 is also undefined and can vary whereas the amount of current flowing through the second sampling capacitor $420_{A2}$ is almost zero and is dependent on a defined voltage value.

In the illustrated example of FIG. 7, at the first time 712, $t_1$, and throughout the remainder of the time illustrated in the timing diagram 700, the voltage measured between the negative integrated output terminal $428_A$ and the positive integrated output terminal $428_B$ of FIG. 4 (not illustrated) is relatively constant compared to the voltage measured between the negative integrated output terminal $122_A$ and the positive integrated output terminal $122_B$ of FIG. 2 (not illustrated). For example, as illustrated in the fourth example plot 708, the voltage measured between the negative integrated output terminal $122_A$ and the positive integrated output terminal $122_B$ of FIG. 2 (not illustrated) drifts and decreases across the second operational phase (e.g., the charge transfer phase). The longer the second operational phase, the more leakage current will pass through the second sampling capacitor $114_{A2}$ and the more the voltage measured between the negative integrated output terminal $122_A$ and the positive integrated output terminal $122_B$ of FIG. 2 (not illustrated) will drift.

In the illustrated example of FIG. 7, at the first time 712, $t_1$, and throughout the remainder of the time illustrated in the timing diagram 700, the derivative of the voltage measured between the negative integrated output terminal $428_A$ and the positive integrated output terminal $428_B$ of FIG. 4 (not illustrated) with respect to time is relatively constant compared to the derivative of the voltage measured between the negative integrated output terminal $122_A$ and the positive integrated output terminal 122B of FIG. 2 (not illustrated) with respect to time. For example, as illustrated in the fifth example plot 710, the derivative of the voltage measured between the negative integrated output terminal $428_A$ and the positive integrated output terminal $428_B$ of FIG. 4 (not illustrated) with respect to time is over 1,000 times (1,000×) smaller than the derivative of the voltage measured between the negative integrated output terminal $122_A$ and the positive integrated output terminal $122_B$ of FIG. 2 (not illustrated) with respect to time.

While an example manner of implementing the ADC 400 of FIG. 4 is illustrated in FIG. 4, one or more of the elements, processes, and/or devices illustrated in FIG. 4 may be combined, divided, re-arranged, omitted, eliminated, and/or implemented in any other way. Further, the example bias control circuitry 402, the example sampling circuitry 404, the example sampling capacitor enable circuitry 406, the example gain control circuitry 408, the example switch control circuitry 410, the example converter circuitry 412, the example clock 414, and/or, more generally, the example ADC 400 of FIG. 4, may be implemented by hardware alone or by hardware in combination with software and/or firmware. Thus, for example, any of the example bias control circuitry 402, the example sampling circuitry 404, the example sampling capacitor enable circuitry 406, the example gain control circuitry 408, the example switch control circuitry 410, the example converter circuitry 412, the example clock 414, and/or, more generally, the example ADC 400 of FIG. 4, could be implemented by programmable circuitry in combination with machine-readable instructions (e.g., firmware or software), processor circuitry, analog circuit(s), digital circuit(s), logic circuit(s), programmable processor(s), programmable microcontroller(s), graphics processing unit(s) (GPU(s)), digital signal processor(s) (DSP(s)), ASIC(s), programmable logic device(s) (PLD(s)), and/or field programmable logic device(s) (FPLD(s)) such as FPGAs. Further still, the example ADC 400 of FIG. 4 may include one or more elements, processes, and/or devices in addition to, or instead of, those illustrated in FIG. 4, and/or may include more than one of any or all of the illustrated elements, processes, and devices.

Figure 8:
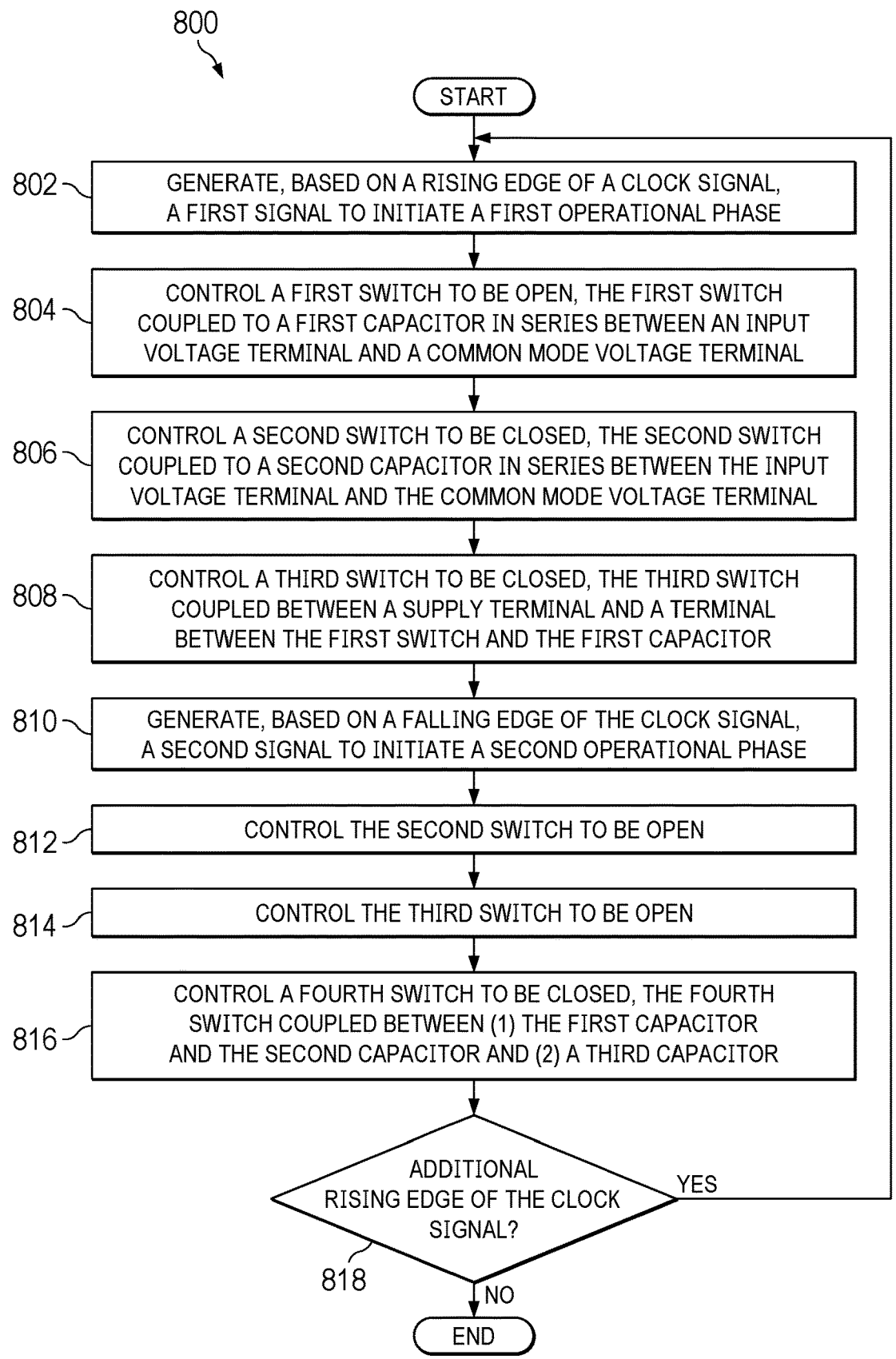
FIG. 8 is a flowchart representative of example machine-readable instructions and/or example operations that may be executed, instantiated, and/or performed using an example programmable circuitry implementation of the ADC of FIG. 4.

A flowchart representative of example machine-readable instructions, which may be executed by programmable circuitry to implement and/or instantiate the ADC 400 of FIG. 4 and/or representative of example operations which may be performed by programmable circuitry to implement and/or instantiate the ADC 400 of FIG. 4, is shown in FIG. 8. The machine-readable instructions may be one or more executable programs or portion(s) of one or more executable programs for execution by programmable circuitry such as the programmable circuitry 912 shown in the example programmable circuitry platform 900 described below in connection with FIG. 9 and/or may be one or more function(s) or portion(s) of functions to be performed by the example programmable circuitry (e.g., an FPGA) described below in connection with FIGS. 10 and/or 11. In some examples, the machine-readable instructions cause an operation, a task, etc., to be carried out and/or performed in an automated manner in the real world. As used herein, "automated" means without human involvement.

The program may be embodied in instructions (e.g., software and/or firmware) stored on one or more non-transitory computer-readable and/or machine-readable storage medium such as cache memory, a magnetic-storage device or disk (e.g., a floppy disk, a Hard Disk Drive (HDD), etc.), an optical-storage device or disk (e.g., a Blu-ray disk, a Compact Disk (CD), a Digital Versatile Disk (DVD), etc.), a Redundant Array of Independent Disks (RAID), a register, ROM, a solid-state drive (SSD), SSD memory, non-volatile memory (e.g., electrically erasable programmable read-only memory (EEPROM), flash memory, etc.), volatile memory (e.g., Random Access Memory (RAM) of any type, etc.), and/or any other storage device or storage disk. The instructions of the non-transitory computer-readable and/or machine-readable medium may program and/or be executed by programmable circuitry located in one or more hardware devices, but the entire program and/or parts thereof could alternatively be executed and/or instantiated by one or more hardware devices other than the programmable circuitry and/or embodied in dedicated hardware. The machine-readable instructions may be distributed across multiple hardware devices and/or executed by two or more hardware devices (e.g., a server and a client hardware device). For example, the client hardware device may be implemented by an endpoint client hardware device (e.g., a hardware device associated with a human and/or machine user) or an intermediate client hardware device gateway (e.g., a radio access network (RAN)) that may facilitate communication between a server and an endpoint client hardware device. Similarly, the non-transitory computer-readable storage medium may include one or more mediums. Further, although the example program is described with reference to the flowchart(s) illustrated in FIG. 8, many other methods of implementing the example ADC 400 may alternatively be used. For example, the order of execution of the blocks of the flowchart(s) may be changed, and/or some of the blocks described may be changed, eliminated, or combined. Additionally or alternatively, any or all of the blocks of the flow chart may be implemented by one or more hardware circuits (e.g., processor circuitry, discrete and/or integrated analog and/or digital circuitry, an FPGA, an ASIC, a comparator, an operational-amplifier (op-amp), a logic circuit, etc.) structured to perform the corresponding operation without executing software or firmware. The programmable circuitry may be distributed in different network locations and/or local to one or more hardware devices (e.g., a single-core processor (e.g., a single core CPU), a multi-core processor (e.g., a multi-core CPU, an XPU, etc.)). For example, the programmable circuitry may be a CPU and/or an FPGA located in the same package (e.g., the same integrated circuit (IC) package or in two or more separate housings), one or more processors in a single machine, multiple processors distributed across multiple servers of a server rack, multiple processors distributed across one or more server racks, etc., and/or any combination(s) thereof.

The machine-readable instructions described herein may be stored in one or more of a compressed format, an encrypted format, a fragmented format, a compiled format, an executable format, a packaged format, etc. Machine-readable instructions as described herein may be stored as data (e.g., computer-readable data, machine-readable data, one or more bits (e.g., one or more computer-readable bits, one or more machine-readable bits, etc.), a bitstream (e.g., a computer-readable bitstream, a machine-readable bitstream, etc.), etc.) or a data structure (e.g., as portion(s) of instructions, code, representations of code, etc.) that may be utilized to create, manufacture, and/or produce machine-executable instructions. For example, the machine-readable instructions may be fragmented and stored on one or more storage devices, disks and/or computing devices (e.g., servers) located at the same or different locations of a network or collection of networks (e.g., in the cloud, in edge devices, etc.). The machine-readable instructions may require one or more of installation, modification, adaptation, updating, combining, supplementing, configuring, decryption, decompression, unpacking, distribution, reassignment, compilation, etc., in order to make them directly readable, interpretable, and/or executable by a computing device and/or other machine. For example, the machine-readable instructions may be stored in multiple parts, which are individually compressed, encrypted, and/or stored on separate computing devices, wherein the parts when decrypted, decompressed, and/or combined form a set of computer-executable and/or machine-executable instructions that implement one or more functions and/or operations that may together form a program such as that described herein.

In another example, the machine-readable instructions may be stored in a state in which they may be read by programmable circuitry, but require addition of a library (e.g., a dynamic link library (DLL)), a software development kit (SDK), an application programming interface (API), etc., in order to execute the machine-readable instructions on a particular computing device or other device. In another example, the machine-readable instructions may need to be configured (e.g., settings stored, data input, network addresses recorded, etc.) before the machine-readable instructions and/or the corresponding program(s) can be executed in whole or in part. Thus, machine-readable, computer-readable and/or machine-readable media, as used herein, may include instructions and/or program(s) regardless of the particular format or state of the machine-readable instructions and/or program(s).

The machine-readable instructions described herein can be represented by any past, present, or future instruction language, scripting language, programming language, etc. For example, the machine-readable instructions may be represented using any of the following languages: C. C++, Java, C #, Perl, Python, JavaScript, HyperText Markup Language (HTML), Structured Query Language (SQL), Swift, etc.

As mentioned above, the example operations of FIG. 8 may be implemented using executable instructions (e.g., computer-readable and/or machine-readable instructions) stored on one or more non-transitory computer-readable and/or machine-readable media. As used herein, the terms non-transitory computer-readable medium, non-transitory computer-readable storage medium, non-transitory machine-readable medium, and/or non-transitory machine-readable storage medium are expressly defined to include any type of computer-readable storage device and/or storage disk and to exclude propagating signals and to exclude transmission media. Examples of such non-transitory computer-readable medium, non-transitory computer-readable storage medium, non-transitory machine-readable medium, and/or non-transitory machine-readable storage medium include optical storage devices, magnetic storage devices, an HDD, a flash memory, a read-only memory (ROM), a CD, a DVD, a cache, a RAM of any type, a register, and/or any other storage device or storage disk in which information is stored for any duration (e.g., for extended time periods, permanently, for brief instances, for temporarily buffering, and/or for caching of the information). As used herein, the terms "non-transitory computer-readable storage device" and "non-transitory machine-readable storage device" are defined to include any physical (mechanical, magnetic and/or electrical) hardware to retain information for a time period, but to exclude propagating signals and to exclude transmission media. Examples of non-transitory computer-readable storage devices and/or non-transitory machine-readable storage devices include random access memory of any type, read only memory of any type, solid state memory, flash memory, optical discs, magnetic disks, disk drives, and/or redundant array of independent disks (RAID) systems. As used herein, the term "device" refers to physical structure such as mechanical and/or electrical equipment, hardware, and/or circuitry that may or may not be configured by computer-readable instructions, machine-readable instructions, etc., and/or manufactured to execute computer-readable instructions, machine-readable instructions, etc.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, it is to be understood that additional elements, terms, etc., may be present without falling outside the scope of the corresponding claim or recitation. As used herein, when the phrase "at least" is used as the transition term in, for example, a preamble of a claim, it is open-ended in the same manner as the term "comprising" and "including" are open ended. As used herein, singular references (e.g., "a," "an," "first," "second," etc.) do not exclude a plurality. The term "a" or "an" object, as used herein, refers to one or more of that object. The terms "a" (or "an"), "one or more," and "at least one" are used interchangeably herein. Furthermore, although individually listed, a plurality of means, elements, or actions may be implemented by, e.g., the same entity or object. Additionally, although individual features may be included in different examples or claims, these may possibly be combined, and the inclusion in different examples or claims does not imply that a combination of features is not feasible and/or advantageous.

FIG. 8 is a flowchart representative of example machine-readable instructions and/or example operations 800 that may be executed, instantiated, and/or performed using an example programmable circuitry implementation of the ADC 400 of FIG. 4. The example machine-readable instructions and/or the example operations 800 of FIG. 8 begin at block 802, at which the switch control circuitry 410 generates, based on a rising edge of a clock signal, a first signal to initiate a first operational phase of the sampling circuitry 404. For example, the switch control circuitry 410 generates the first signal at the first output terminal of the switch control circuitry 410 based on the clock signal generated by the clock 414.

In the illustrated example of FIG. 8, at block 804, the gain control circuitry 408 controls a first switch to be open, the first switch coupled to a first capacitor in series between an input voltage terminal and a common mode voltage terminal. For example, at block 804, the gain control circuitry 408 controls the second sampling switch $418_{A2}$ to be open. In the example of FIG. 8, at block 806, the switch control circuitry 410 controls a second switch to be closed, the second switch coupled to a second capacitor in series between the input voltage terminal and the common mode voltage terminal. For example, at block 806, the switch control circuitry 410 controls the first sampling switch $418_{A1}$ to be closed.

In the illustrated example of FIG. 8, at block 808, the bias control circuitry 402 controls a third switch to be closed, the third switch coupled between a supply terminal and a terminal between the first switch and the first capacitor. For example, at block 808, the bias control circuitry 402 controls the biasing switch $438_A$ to be closed. In the example of FIG. 8, at block 810, the switch control circuitry 410 generates, based on a falling edge of the clock signal, a second signal to initiate a second operational phase of the sampling circuitry 404. For example, the switch control circuitry 410 generates the second signal at the second output terminal of the switch control circuitry 410 based on the clock signal generated by the clock 414.

In the illustrated example of FIG. 8, at block 812, the switch control circuitry 410 controls the second switch to be open. For example, at block 812, the switch control circuitry 410 controls the first sampling switch $418_{A1}$ to be open. In the example of FIG. 8, at block 814, the bias control circuitry 402 controls the third switch to be open. For example, at block 814, the bias control circuitry 402 controls the biasing switch $438_A$ to be open. At block 816, the switch control circuitry 410 controls a fourth switch to be closed, the fourth switch coupled between (1) the first capacitor and the second capacitor and (2) a third capacitor. For example, at block 816, the switch control circuitry 410 controls the charge transfer switch $422_A$ to be closed.

In the illustrated example of FIG. 8, at block 818, the switch control circuitry 410 determines whether there is an additional rising edge of the clock signal. Based on (e.g., in response to) the switch control circuitry 410 determining that there is an additional rising edge of the clock signal (block 818: YES), the machine-readable instructions and/or the operations 800 return to block 802. Based on (e.g., in response to) the switch control circuitry 410 determining that there is not an additional rising edge of the clock signal (block 818: NO), the machine-readable instructions and/or the operations 800 terminate.

Figure 9:
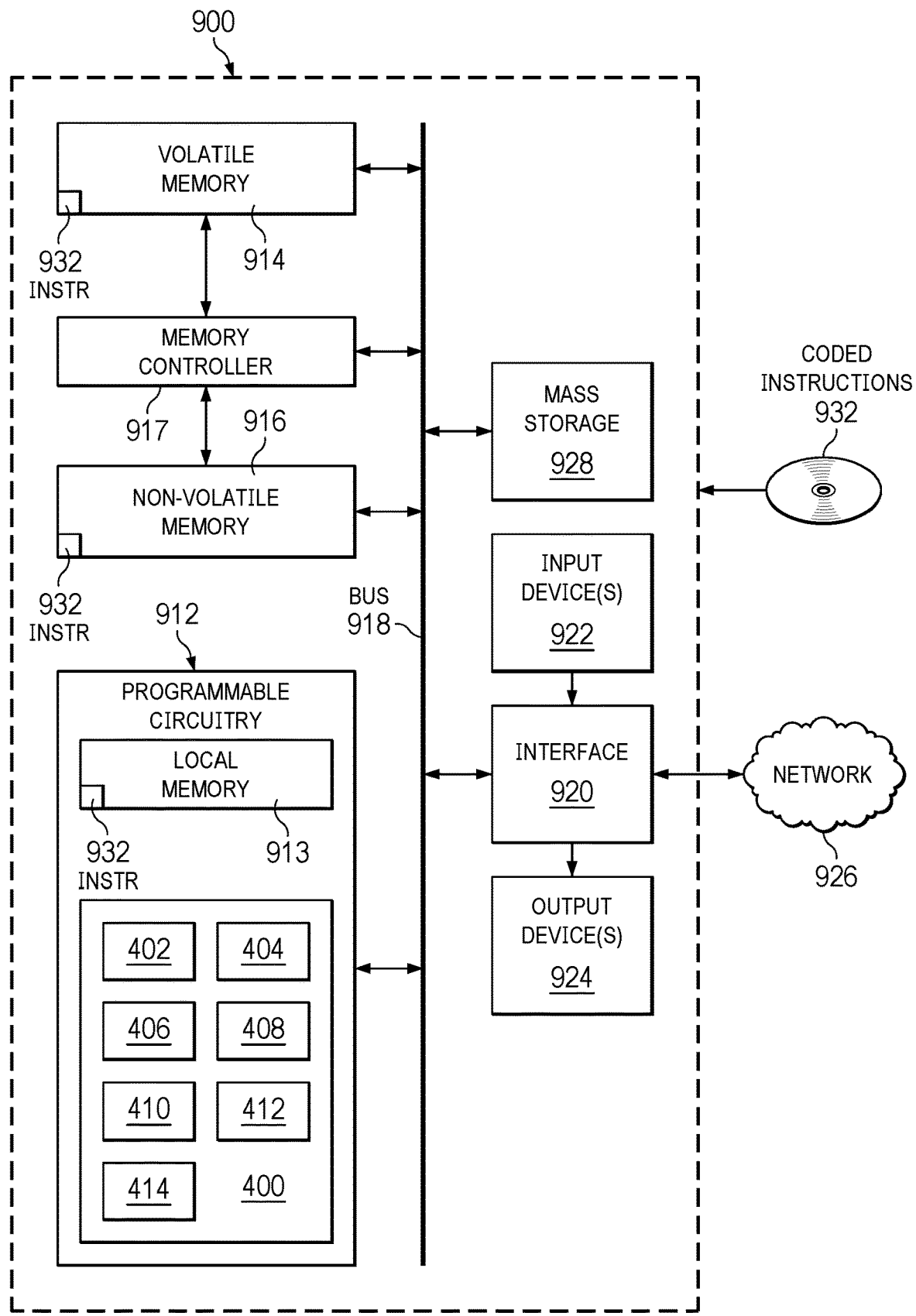
FIG. 9 is a block diagram of an example processing platform including programmable circuitry structured to execute, instantiate, and/or perform the example machine-readable instructions and/or perform the example operations of FIG. 8 to implement the ADC 400 of FIG. 4.

FIG. 9 is a block diagram of an example programmable circuitry platform 900 structured to execute and/or instantiate the example machine-readable instructions and/or the example operations of FIG. 8 to implement the ADC 400 of FIG. 4. The programmable circuitry platform 900 can be, for example, a server, a personal computer, a workstation, a self-learning machine (e.g., a neural network), a mobile device (e.g., a cell phone, a smart phone, a tablet such as an iPad™), a personal digital assistant (PDA), an Internet appliance, a DVD player, a CD player, a digital video recorder, a Blu-ray player, a gaming console, a personal video recorder, a set top box, a headset (e.g., an augmented reality (AR) headset, a virtual reality (VR) headset, etc.) or other wearable device, or any other type of computing and/or electronic device.

The programmable circuitry platform 900 of the illustrated example includes programmable circuitry 912. The programmable circuitry 912 of the illustrated example is hardware. For example, the programmable circuitry 912 can be implemented by one or more integrated circuits, logic circuits, FPGAs, microprocessors, CPUs, GPUs, DSPs, and/or microcontrollers from any desired family or manufacturer. The programmable circuitry 912 may be implemented by one or more semiconductor based (e.g., silicon based) devices. In this example, the programmable circuitry 912 implements the example bias control circuitry 402, the example sampling circuitry 404, the example sampling capacitor enable circuitry 406, the example gain control circuitry 408, the example switch control circuitry 410, the example converter circuitry 412, the example clock 414, and/or, more generally, the example ADC 400 of FIG. 4.

The programmable circuitry 912 of the illustrated example includes a local memory 913 (e.g., a cache, registers, etc.). The programmable circuitry 912 of the illustrated example is in communication with main memory 914, 916, which includes a volatile memory 914 and a non-volatile memory 916, by a bus 918. The volatile memory 914 may be implemented by Synchronous Dynamic Random Access Memory (SDRAM), Dynamic Random Access Memory (DRAM), RAMBUS® Dynamic Random Access Memory (RDRAM®), and/or any other type of RAM device. The non-volatile memory 916 may be implemented by flash memory and/or any other desired type of memory device. Access to the main memory 914, 916 of the illustrated example is controlled by a memory controller 917. In some examples, the memory controller 917 may be implemented by one or more integrated circuits, logic circuits, microcontrollers from any desired family or manufacturer, or any other type of circuitry to manage the flow of data going to and from the main memory 914, 916.

The programmable circuitry platform 900 of the illustrated example also includes interface circuitry 920. The interface circuitry 920 may be implemented by hardware in accordance with any type of interface standard, such as an Ethernet interface, a universal serial bus (USB) interface, a Bluetooth® interface, a near field communication (NFC) interface, a Peripheral Component Interconnect (PCI) interface, and/or a Peripheral Component Interconnect Express (PCIe) interface.

In the illustrated example, one or more input devices 922 are connected to the interface circuitry 920. The input device(s) 922 permit(s) a user (e.g., a human user, a machine user, etc.) to enter data and/or commands into the programmable circuitry 912. The input device(s) 922 can be implemented by, for example, an audio sensor, a microphone, a camera (still or video), a keyboard, a button, a mouse, a touchscreen, a trackpad, a trackball, an isopoint device, and/or a voice recognition system.

One or more output devices 924 are also connected to the interface circuitry 920 of the illustrated example. The output device(s) 924 can be implemented, for example, by display devices (e.g., a light emitting diode (LED), an organic light emitting diode (OLED), a liquid crystal display (LCD), a cathode ray tube (CRT) display, an in-place switching (IPS) display, a touchscreen, etc.), a tactile output device, a printer, and/or speaker. The interface circuitry 920 of the illustrated example, thus, typically includes a graphics driver card, a graphics driver chip, and/or graphics processor circuitry such as a GPU.

The interface circuitry 920 of the illustrated example also includes a communication device such as a transmitter, a receiver, a transceiver, a modem, a residential gateway, a wireless access point, and/or a network interface to facilitate exchange of data with external machines (e.g., computing devices of any kind) by a network 926. The communication can be by, for example, an Ethernet connection, a digital subscriber line (DSL) connection, a telephone line connection, a coaxial cable system, a satellite system, a beyond-line-of-sight wireless system, a line-of-sight wireless system, a cellular telephone system, an optical connection, etc.

The programmable circuitry platform 900 of the illustrated example also includes one or more mass storage discs or devices 928 to store firmware, software, and/or data. Examples of such mass storage discs or devices 928 include magnetic storage devices (e.g., floppy disk, drives, HDDs, etc.), optical storage devices (e.g., Blu-ray disks, CDs, DVDs, etc.), RAID systems, and/or solid-state storage discs or devices such as flash memory devices and/or SSDs.

The machine-readable instructions 932, which may be implemented by the machine-readable instructions of FIG. 8, may be stored in the mass storage device 928, in the volatile memory 914, in the non-volatile memory 916, and/or on at least one non-transitory computer-readable storage medium such as a CD or DVD which may be removable.

Figure 10:
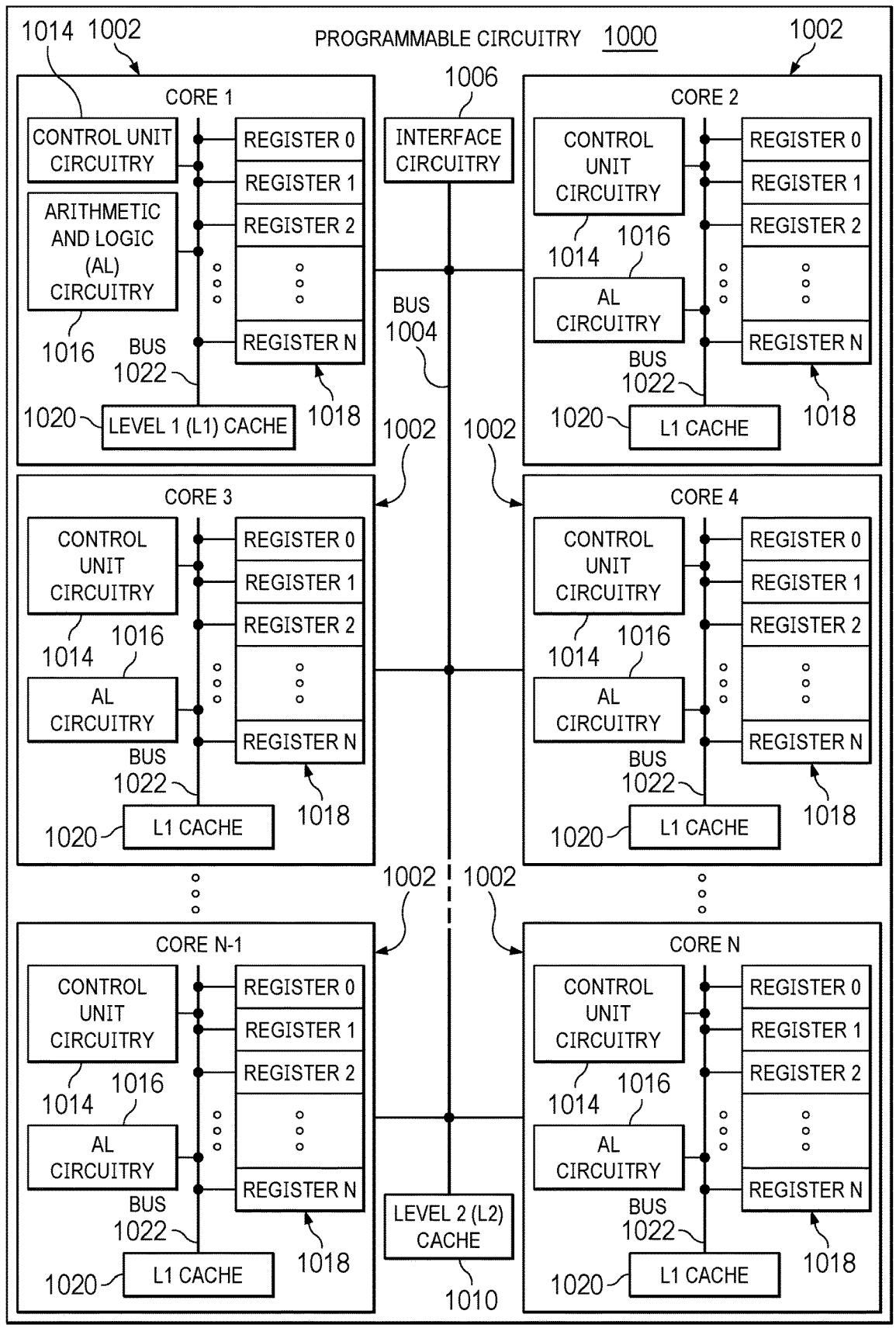
FIG. 10 is a block diagram of an example implementation of the programmable circuitry of FIG. 9.

FIG. 10 is a block diagram of an example implementation of the programmable circuitry 912 of FIG. 9. In this example, the programmable circuitry 912 of FIG. 9 is implemented by a microprocessor 1000. For example, the microprocessor 1000 may be a general-purpose microprocessor (e.g., general-purpose microprocessor circuitry). The microprocessor 1000 executes some or all of the machine-readable instructions of the flowchart of FIG. 8 to effectively instantiate the circuitry of FIG. 4 as logic circuits to perform operations corresponding to those machine-readable instructions. In some such examples, the circuitry of FIG. 4 is instantiated by the hardware circuits of the microprocessor 1000 in combination with the machine-readable instructions. For example, the microprocessor 1000 may be implemented by multi-core hardware circuitry such as a CPU, a DSP, a GPU, an XPU, etc. Although it may include any number of example cores 1002 (e.g., 1 core), the microprocessor 1000 of this example is a multi-core semiconductor device including N cores. The cores 1002 of the microprocessor 1000 may operate independently or may cooperate to execute machine-readable instructions. For example, machine code corresponding to a firmware program, an embedded software program, or a software program may be executed by one of the cores 1002 or may be executed by multiple ones of the cores 1002 at the same or different times. In some examples, the machine code corresponding to the firmware program, the embedded software program, or the software program is split into threads and executed in parallel by two or more of the cores 1002. The software program may correspond to a portion or all of the machine-readable instructions and/or operations represented by the flowchart of FIG. 8.

The cores 1002 may communicate by a first example bus 1004. In some examples, the first bus 1004 may be implemented by a communication bus to effectuate communication associated with one(s) of the cores 1002. For example, the first bus 1004 may be implemented by at least one of an Inter-Integrated Circuit (I2C) bus, a Serial Peripheral Interface (SPI) bus, a PCI bus, or a PCIe bus. Additionally or alternatively, the first bus 1004 may be implemented by any other type of computing or electrical bus. The cores 1002 may obtain data, instructions, and/or signals from one or more external devices by example interface circuitry 1006. The cores 1002 may output data, instructions, and/or signals to the one or more external devices by the interface circuitry 1006. Although the cores 1002 of this example include example local memory 1020 (e.g., Level 1 (L1) cache that may be split into an L1 data cache and an L1 instruction cache), the microprocessor 1000 also includes example shared memory 1010 that may be shared by the cores (e.g., Level 2 (L2 cache)) for high-speed access to data and/or instructions. Data and/or instructions may be transferred (e.g., shared) by writing to and/or reading from the shared memory 1010. The local memory 1020 of each of the cores 1002 and the shared memory 1010 may be part of a hierarchy of storage devices including multiple levels of cache memory and the main memory (e.g., the main memory 914, 916 of FIG. 9). Typically, higher levels of memory in the hierarchy exhibit lower access time and have smaller storage capacity than lower levels of memory. Changes in the various levels of the cache hierarchy are managed (e.g., coordinated) by a cache coherency policy.

Each core 1002 may be referred to as a CPU, DSP, GPU, etc., or any other type of hardware circuitry. Each core 1002 includes control unit circuitry 1014, arithmetic and logic (AL) circuitry 1016 (sometimes referred to as an ALU), a plurality of registers 1018, the local memory 1020, and a second example bus 1022. Other structures may be present. For example, each core 1002 may include vector unit circuitry, single instruction multiple data (SIMD) unit circuitry, load/store unit (LSU) circuitry, branch/jump unit circuitry, floating-point unit (FPU) circuitry, etc. The control unit circuitry 1014 includes semiconductor-based circuits structured to control (e.g., coordinate) data movement within the corresponding core 1002. The AL circuitry 1016 includes semiconductor-based circuits structured to perform one or more mathematic and/or logic operations on the data within the corresponding core 1002. The AL circuitry 1016 of some examples performs integer-based operations. In other examples, the AL circuitry 1016 also performs floating-point operations. In yet other examples, the AL circuitry 1016 may include first AL circuitry that performs integer-based operations and second AL circuitry that performs floating-point operations. In some examples, the AL circuitry 1016 may be referred to as an Arithmetic Logic Unit (ALU).

The registers 1018 are semiconductor-based structures to store data and/or instructions such as results of one or more of the operations performed by the AL circuitry 1016 of the corresponding core 1002. For example, the registers 1018 may include vector register(s), SIMD register(s), general-purpose register(s), flag register(s), segment register(s), machine-specific register(s), instruction pointer register(s), control register(s), debug register(s), memory management register(s), machine check register(s), etc. The registers 1018 may be arranged in a bank as shown in FIG. 10. Alternatively, the registers 1018 may be organized in any other arrangement, format, or structure, such as by being distributed throughout the core 1002 to shorten access time. The second bus 1022 may be implemented by at least one of an I2C bus, a SPI bus, a PCI bus, or a PCIe bus.

Each core 1002 and/or, more generally, the microprocessor 1000 may include additional and/or alternate structures to those shown and described above. For example, one or more clock circuits, one or more power supplies, one or more power gates, one or more cache home agents (CHAs), one or more converged/common mesh stops (CMSs), one or more shifters (e.g., barrel shifter(s)) and/or other circuitry may be present. The microprocessor 1000 is a semiconductor device fabricated to include many transistors interconnected to implement the structures described above in one or more integrated circuits (ICs) contained in one or more packages.

The microprocessor 1000 may include and/or cooperate with one or more accelerators (e.g., acceleration circuitry, hardware accelerators, etc.). In some examples, accelerators are implemented by logic circuitry to perform certain tasks more quickly and/or efficiently than can be done by a general-purpose processor. Examples of accelerators include ASICs and FPGAs such as those described herein. A GPU, DSP and/or other programmable device can also be an accelerator. Accelerators may be on-board the microprocessor 1000, in the same chip package as the microprocessor 1000 and/or in one or more separate packages from the microprocessor 1000.

Figure 11:
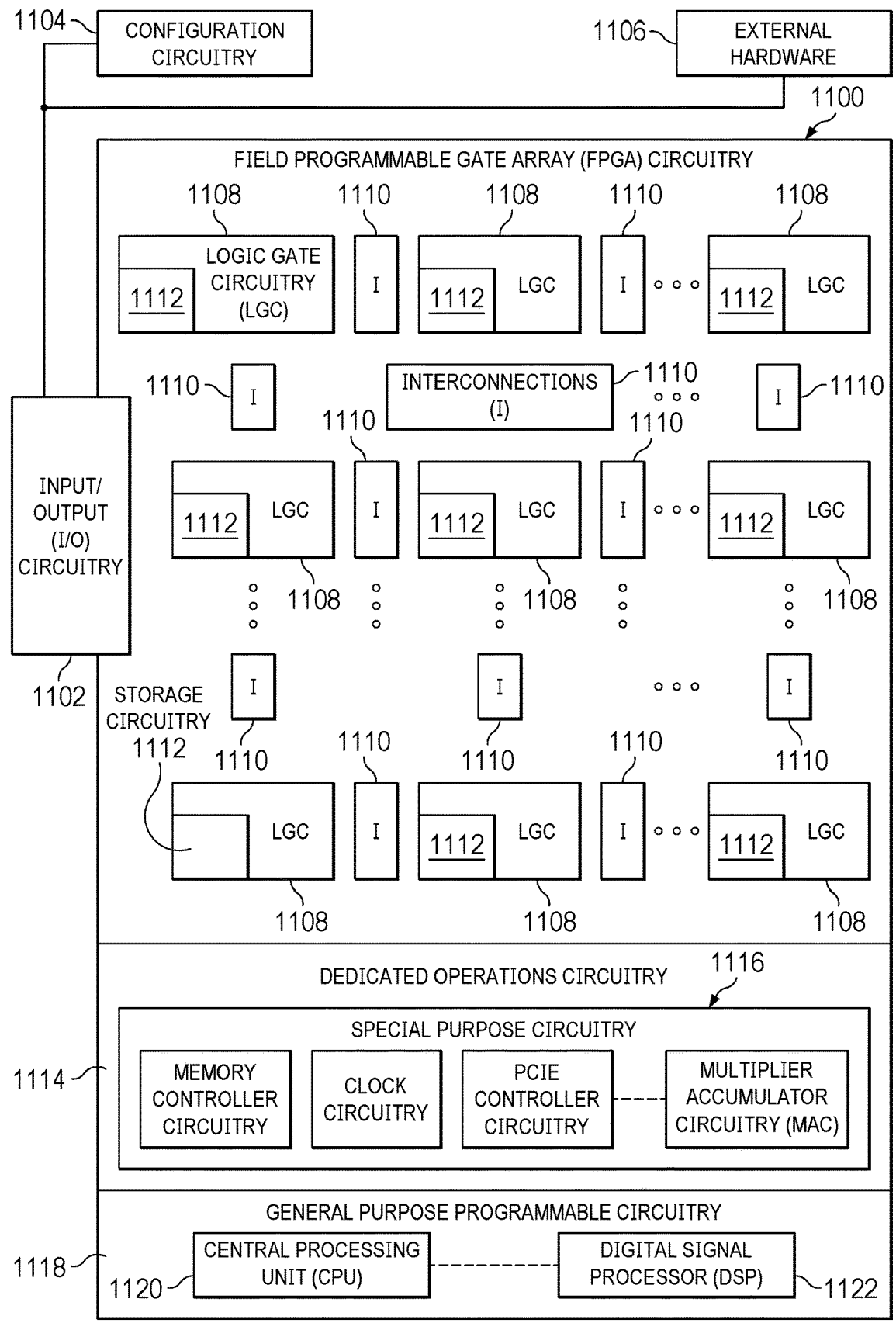
FIG. 11 is a block diagram of another example implementation of the programmable circuitry of FIG. 9.

FIG. 11 is a block diagram of another example implementation of the programmable circuitry 912 of FIG. 9. In this example, the programmable circuitry 912 is implemented by FPGA circuitry 1100. For example, the FPGA circuitry 1100 may be implemented by an FPGA. The FPGA circuitry 1100 can be used, for example, to perform operations that could otherwise be performed by the example microprocessor 1000 of FIG. 10 executing corresponding machine-readable instructions. However, once configured, the FPGA circuitry 1100 instantiates the operations and/or functions corresponding to the machine-readable instructions in hardware and, thus, can often execute the operations/functions faster than they could be performed by a general-purpose microprocessor executing the corresponding software.

More specifically, in contrast to the microprocessor 1000 of FIG. 10 described above (which is a general purpose device that may be programmed to execute some or all of the machine-readable instructions represented by the flowchart of FIG. 8 but whose interconnections and logic circuitry are fixed once fabricated), the FPGA circuitry 1100 of the example of FIG. 11 includes interconnections and logic circuitry that may be configured, structured, programmed, and/or interconnected in different ways after fabrication to instantiate, for example, some or all of the operations/functions corresponding to the machine-readable instructions represented by the flowchart of FIG. 8. In particular, the FPGA circuitry 1100 may be thought of as an array of logic gates, interconnections, and switches. The switches can be programmed to change how the logic gates are interconnected by the interconnections, effectively forming one or more dedicated logic circuits (unless and until the FPGA circuitry 1100 is reprogrammed). The configured logic circuits enable the logic gates to cooperate in different ways to perform different operations on data received by input circuitry. Those operations may correspond to some or all of the instructions (e.g., the software and/or firmware) represented by the flowchart of FIG. 8. As such, the FPGA circuitry 1100 may be configured and/or structured to effectively instantiate some or all of the operations/functions corresponding to the machine-readable instructions of the flowchart of FIG. 8 as dedicated logic circuits to perform the operations/functions corresponding to those software instructions in a dedicated manner analogous to an ASIC. Therefore, the FPGA circuitry 1100 may perform the operations/functions corresponding to the some or all of the machine-readable instructions of FIG. 8 faster than the general-purpose microprocessor can execute the same.

In the example of FIG. 11, the FPGA circuitry 1100 is configured and/or structured in response to being programmed (and/or reprogrammed one or more times) based on a binary file. In some examples, the binary file may be compiled and/or generated based on instructions in a hardware description language (HDL) such as Lucid, Very High Speed Integrated Circuits (VHSIC) Hardware Description Language (VHDL), or Verilog. For example, a user (e.g., a human user, a machine user, etc.) may write code or a program corresponding to one or more operations/functions in an HDL; the code/program may be translated into a low-level language as needed; and the code/program (e.g., the code/program in the low-level language) may be converted (e.g., by a compiler, a software application, etc.) into the binary file. In some examples, the FPGA circuitry 1100 of FIG. 11 may access and/or load the binary file to cause the FPGA circuitry 1100 of FIG. 11 to be configured and/or structured to perform the one or more operations/functions. For example, the binary file may be implemented by a bit stream (e.g., one or more computer-readable bits, one or more machine-readable bits, etc.), data (e.g., computer-readable data, machine-readable data, etc.), and/or machine-readable instructions accessible to the FPGA circuitry 1100 of FIG. 11 to cause configuration and/or structuring of the FPGA circuitry 1100 of FIG. 11, or portion(s) thereof.

In some examples, the binary file is compiled, generated, transformed, and/or otherwise output from a uniform software platform utilized to program FPGAs. For example, the uniform software platform may translate first instructions (e.g., code or a program) that correspond to one or more operations/functions in a high-level language (e.g., C, C++, Python, etc.) into second instructions that correspond to the one or more operations/functions in an HDL. In some such examples, the binary file is compiled, generated, and/or otherwise output from the uniform software platform based on the second instructions. In some examples, the FPGA circuitry 1100 of FIG. 11 may access and/or load the binary file to cause the FPGA circuitry 1100 of FIG. 11 to be configured and/or structured to perform the one or more operations/functions. For example, the binary file may be implemented by a bit stream (e.g., one or more computer-readable bits, one or more machine-readable bits, etc.), data (e.g., computer-readable data, machine-readable data, etc.), and/or machine-readable instructions accessible to the FPGA circuitry 1100 of FIG. 11 to cause configuration and/or structuring of the FPGA circuitry 1100 of FIG. 11, or portion(s) thereof.

The FPGA circuitry 1100 of FIG. 11, includes example input/output (I/O) circuitry 1102 to obtain and/or output data to/from example configuration circuitry 1104 and/or external hardware 1106. For example, the configuration circuitry 1104 may be implemented by interface circuitry that may obtain a binary file, which may be implemented by a bit stream, data, and/or machine-readable instructions, to configure the FPGA circuitry 1100, or portion(s) thereof. In some such examples, the configuration circuitry 1104 may obtain the binary file from a user, a machine (e.g., hardware circuitry (e.g., programmable or dedicated circuitry) that may implement an Artificial Intelligence/Machine Learning (AI/ML) model to generate the binary file), etc., and/or any combination(s) thereof). In some examples, the external hardware 1106 may be implemented by external hardware circuitry. For example, the external hardware 1106 may be implemented by the microprocessor 1000 of FIG. 10.

The FPGA circuitry 1100 also includes an array of example logic gate circuitry 1108, a plurality of example configurable interconnections 1110, and example storage circuitry 1112. The logic gate circuitry 1108 and the configurable interconnections 1110 are configurable to instantiate one or more operations/functions that may correspond to at least some of the machine-readable instructions of FIG. 8 and/or other desired operations. The logic gate circuitry 1108 shown in FIG. 11 is fabricated in blocks or groups. Each block includes semiconductor-based electrical structures that may be configured into logic circuits. In some examples, the electrical structures include logic gates (e.g., And gates, Or gates, Nor gates, etc.) that provide basic building blocks for logic circuits. Electrically controllable switches (e.g., transistors) are present within each of the logic gate circuitry 1108 to enable configuration of the electrical structures and/or the logic gates to form circuits to perform desired operations/functions. The logic gate circuitry 1108 may include other electrical structures such as look-up tables (LUTs), registers (e.g., flip-flops or latches), multiplexers, etc.

The configurable interconnections 1110 of the illustrated example are conductive pathways, traces, vias, or the like that may include electrically controllable switches (e.g., transistors) whose state can be changed by programming (e.g., using an HDL instruction language) to activate or deactivate one or more connections between one or more of the logic gate circuitry 1108 to program desired logic circuits.

The storage circuitry 1112 of the illustrated example is structured to store result(s) of the one or more of the operations performed by corresponding logic gates. The storage circuitry 1112 may be implemented by registers or the like. In the illustrated example, the storage circuitry 1112 is distributed amongst the logic gate circuitry 1108 to facilitate access and increase execution speed.

The example FPGA circuitry 1100 of FIG. 11 also includes example dedicated operations circuitry 1114. In this example, the dedicated operations circuitry 1114 includes special purpose circuitry 1116 that may be invoked to implement commonly used functions to avoid the need to program those functions in the field. Examples of such special purpose circuitry 1116 include memory (e.g., DRAM) controller circuitry, PCIe controller circuitry, clock circuitry, transceiver circuitry, memory, and multiplier-accumulator circuitry. Other types of special purpose circuitry may be present. In some examples, the FPGA circuitry 1100 may also include example general purpose programmable circuitry 1118 such as an example CPU 1120 and/or an example DSP 1122. Other general purpose programmable circuitry 1118 may additionally or alternatively be present such as a GPU, an XPU, etc., that can be programmed to perform other operations.

Although FIGS. 10 and 11 illustrate two example implementations of the programmable circuitry 912 of FIG. 9, many other approaches are contemplated. For example, FPGA circuitry may include an on-board CPU, such as one or more of the example CPU 1120 of FIG. 11. Therefore, the programmable circuitry 912 of FIG. 9 may additionally be implemented by combining at least the example microprocessor 1000 of FIG. 10 and the example FPGA circuitry 1100 of FIG. 11. In some such hybrid examples, one or more cores 1002 of FIG. 10 may execute a first portion of the machine-readable instructions represented by the flowchart of FIG. 8 to perform first operation(s)/function(s), the FPGA circuitry 1100 of FIG. 11 may be configured and/or structured to perform second operation(s)/function(s) corresponding to a second portion of the machine-readable instructions represented by the flowchart of FIG. 8, and/or an ASIC may be configured and/or structured to perform third operation(s)/function(s) corresponding to a third portion of the machine-readable instructions represented by the flowchart of FIG. 8.

It should be understood that some or all of the circuitry of FIG. 4 may, thus, be instantiated at the same or different times. For example, same and/or different portion(s) of the microprocessor 1000 of FIG. 10 may be programmed to execute portion(s) of machine-readable instructions at the same and/or different times. In some examples, same and/or different portion(s) of the FPGA circuitry 1100 of FIG. 11 may be configured and/or structured to perform operations/functions corresponding to portion(s) of machine-readable instructions at the same and/or different times.

In some examples, some or all of the circuitry of FIG. 4 may be instantiated, for example, in one or more threads executing concurrently and/or in series. For example, the microprocessor 1000 of FIG. 10 may execute machine-readable instructions in one or more threads executing concurrently and/or in series. In some examples, the FPGA circuitry 1100 of FIG. 11 may be configured and/or structured to carry out operations/functions concurrently and/or in series. Moreover, in some examples, some or all of the circuitry of FIG. 4 may be implemented within one or more virtual machines and/or containers executing on the microprocessor 1000 of FIG. 10.

In some examples, the programmable circuitry 912 of FIG. 9 may be in one or more packages. For example, the microprocessor 1000 of FIG. 10 and/or the FPGA circuitry 1100 of FIG. 11 may be in one or more packages. In some examples, an XPU may be implemented by the programmable circuitry 912 of FIG. 9, which may be in one or more packages. For example, the XPU may include a CPU (e.g., the microprocessor 1000 of FIG. 10, the CPU 1120 of FIG. 11, etc.) in one package, a DSP (e.g., the DSP 1122 of FIG. 11) in another package, a GPU in yet another package, and an FPGA (e.g., the FPGA circuitry 1100 of FIG. 11) in still yet another package.

Figure 12:
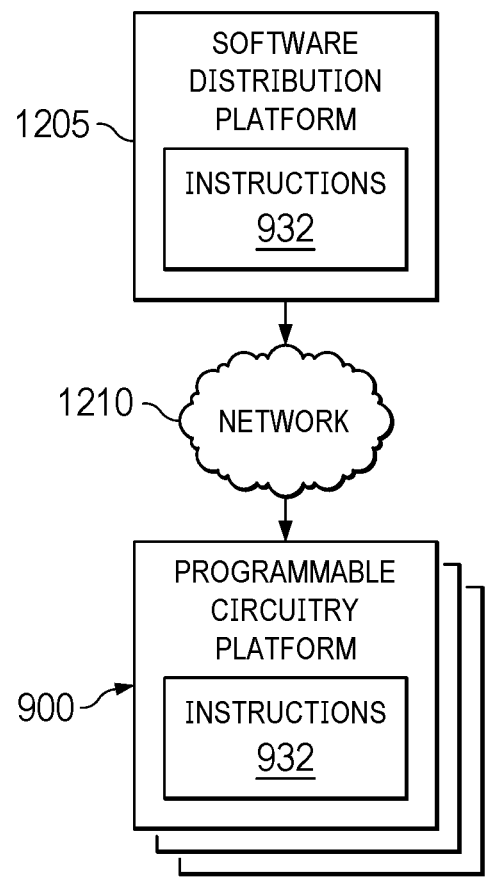
FIG. 12 is a block diagram of an example software/firmware/instructions distribution platform (e.g., one or more servers) to distribute software, instructions, and/or firmware (e.g., corresponding to the example machine-readable instructions of FIG. 8) to client devices associated with end users and/or consumers (e.g., for license, sale, and/or use), retailers (e.g., for sale, re-sale, license, and/or sub-license), and/or original equipment manufacturers (OEMs) (e.g., for inclusion in products to be distributed to, for example, retailers and/or to other end users such as direct buy customers).

A block diagram illustrating an example software distribution platform 1205 to distribute software such as the example machine-readable instructions 932 of FIG. 9 to other hardware devices (e.g., hardware devices owned and/or operated by third parties from the owner and/or operator of the software distribution platform) is illustrated in FIG. 12. The example software distribution platform 1205 may be implemented by any computer server, data facility, cloud service, etc., capable of storing and transmitting software to other computing devices. The third parties may be customers of the entity owning and/or operating the software distribution platform 1205. For example, the entity that owns and/or operates the software distribution platform 1205 may be a developer, a seller, and/or a licensor of software such as the example machine-readable instructions 932 of FIG. 9. The third parties may be consumers, users, retailers, OEMs, etc., who purchase and/or license the software for use and/or re-sale and/or sub-licensing. In the illustrated example, the software distribution platform 1205 includes one or more servers and one or more storage devices. The storage devices store the machine-readable instructions 932, which may correspond to the example machine-readable instructions of FIG. 8, as described above. The one or more servers of the example software distribution platform 1205 are in communication with an example network 1210, which may correspond to any one or more of the Internet and/or any of the example networks described above. In some examples, the one or more servers are responsive to requests to transmit the software to a requesting party as part of a commercial transaction. Payment for the delivery, sale, and/or license of the software may be handled by the one or more servers of the software distribution platform and/or by a third-party payment entity. The servers enable purchasers and/or licensors to download the machine-readable instructions 932 from the software distribution platform 1205. For example, the software, which may correspond to the example machine-readable instructions of FIG. 8, may be downloaded to the example programmable circuitry platform 900, which is to execute the machine-readable instructions 932 to implement the ADC 400. In some examples, one or more servers of the software distribution platform 1205 periodically offer, transmit, and/or force updates to the software (e.g., the example machine-readable instructions 932 of FIG. 9) to ensure improvements, patches, updates, etc., are distributed and applied to the software at the end user devices. Although referred to as software above, the distributed "software" could alternatively be firmware.

In this description, the term "and/or" (when used in a form such as A, B and/or C) refers to any combination or subset of A, B, C, such as: (a) A alone; (b) B alone; (c) C alone; (d) A with B; (e) A with C; (f) B with C; and (g) A with B and with C. Also, as used herein, the phrase "at least one of A or B" (or "at least one of A and B") refers to implementations including any of: (a) at least one A; (b) at least one B; and (c) at least one A and at least one B.

The term "couple" is used throughout the specification. The term may cover connections, communications, or signal paths that enable a functional relationship consistent with this description. For example, if device A provides a signal to control device B to perform an action, in a first example device A is coupled to device B, or in a second example device A is coupled to device B through intervening component C if intervening component C does not substantially alter the functional relationship between device A and device B such that device B is controlled by device A via the control signal provided by device A.

Numerical identifiers such as "first," "second," "third," etc. are used merely to distinguish between elements of substantially the same type in terms of structure and/or function. These identifiers, as used in the detailed description, do not necessarily align with those used in the claims.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal," "node," "interconnection," "pin," and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor. While certain elements of the described examples are included in an integrated circuit and other elements are external to the integrated circuit, in other example embodiments, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means +/−10 percent of the stated value, or, if the value is zero, a reasonable range of values around zero.

Modifications are possible in the described embodiments, and other embodiments are possible, within the scope of the claims.

From the foregoing, it will be appreciated that example systems, apparatus, articles of manufacture, and methods have been described that reduce leakage current flowing through unused sampling capacitors in sampling circuitry. For example, described examples prevent the voltage at input terminals of unused sampling capacitors from floating (e.g., undefined). Additionally, examples described herein reduce power consumption of sampling circuitry by reducing the load on an amplifier (e.g., an op-amp) during the charge transfer phase of sampling circuitry. Examples described herein also improve CMRR of amplifiers (e.g., op-amps). Furthermore, examples described herein do not utilize complex routing and switching and as such can be scaled for multiple gain conditions without complicating layout and routing. Examples described herein can also be retrofitted onto existing circuits with minimal changes to the existing layout and negligible impact on power consumption of existing circuits. For example, described biasing switches can be coupled in parallel with sampling switches of existing circuits. Additionally, due to the reduced power consumption and reduced leakage current achieved by examples described herein, examples described herein are particularly useful for low power applications (e.g., with slow clock rates), large gain condition sampling circuitry, and high temperature applications (e.g., automotive applications). Described systems, apparatus, articles of manufacture, and methods improve the efficiency of using a computing device by reducing power consumption, reducing leakage current, and improving CMRR. Described systems, apparatus, articles of manufacture, and methods are accordingly directed to one or more improvement(s) in the operation of a machine such as a computer or other electronic and/or mechanical device.

The following claims are hereby incorporated into this Detailed Description by this reference. Although certain example systems, apparatus, articles of manufacture, and methods have been described herein, the scope of coverage of this patent is not limited thereto. On the contrary, this patent covers all systems, apparatus, articles of manufacture, and methods fairly falling within the scope of the claims of this patent.

What is claimed is:

1. An apparatus comprising:
bias control circuitry; and
sampling circuitry including:
a first switch coupled to a first capacitor, the first switch and the first capacitor in series between an input voltage terminal and a common mode voltage terminal, the first switch including a first terminal coupled to the input voltage terminal;
a second switch coupled to a second capacitor, the second switch and the second capacitor in series between the input voltage terminal and the common mode voltage terminal, the second switch including a first terminal coupled to the input voltage terminal; and
a third switch including a first terminal, a second terminal, and a control terminal, the first terminal of the third switch coupled to a supply terminal, the second terminal of the third switch coupled between the first switch and the first capacitor, the control terminal coupled to the bias control circuitry.

2. The apparatus of claim 1, wherein:
the first capacitor includes a first terminal;
the second capacitor includes a first terminal; and
the apparatus further includes a fourth switch, a third capacitor, and an operational amplifier (op-amp), the fourth switch having a first terminal and a second terminal, the third capacitor having a first terminal and a second terminal, the op-amp having an input terminal and an output terminal;
the first terminal of the fourth switch is coupled to the first terminal of the first capacitor and the first terminal of the second capacitor;
the second terminal of the fourth switch is coupled to the first terminal of the third capacitor and the input terminal of the op-amp; and
the second terminal of the third capacitor is coupled to the output terminal of the op-amp.

3. The apparatus of claim 2, wherein the apparatus further includes a fifth switch, and the first terminal of the first capacitor and the first terminal of the second capacitor are coupled to the common mode voltage terminal via the fifth switch.

4. The apparatus of claim 3, further including switch control circuitry coupled to the second switch, the fourth switch, and the fifth switch.

5. The apparatus of claim 4, wherein the first switch is to be open, and the switch control circuitry is to:
control the second switch and the fifth switch to be closed during a first operational phase and open during a second operational phase; and
control the fourth switch to be open during the first operational phase and closed during the second operational phase.

6. The apparatus of claim 5, wherein the bias control circuitry is to control the third switch to be closed during the first operational phase and open during the second operational phase.

7. The apparatus of claim 1, wherein the supply terminal is set to a first voltage equivalent to a second voltage at the common mode voltage terminal.

8. An apparatus comprising:
bias control circuitry;
a first switch including a first terminal and a second terminal, the first terminal coupled to an input voltage terminal;
a first capacitor including a first terminal and a second terminal, the first terminal of the first capacitor coupled to the second terminal of the first switch, the second terminal of the first capacitor coupled to a common mode voltage terminal;
a second switch including a first terminal and a second terminal, the first terminal of the second switch coupled to the input voltage terminal;
a second capacitor including a first terminal and a second terminal, the first terminal of the second capacitor coupled to the second terminal of the second switch, the second terminal of the second capacitor coupled to the common mode voltage terminal; and
a third switch including a first terminal, a second terminal, and a control terminal, the first terminal of the third switch coupled to a supply terminal, the second terminal of the third switch coupled to the second terminal of the first switch and the first terminal of the first capacitor, the control terminal coupled to the bias control circuitry.

9. The apparatus of claim 8, wherein:
the first switch includes a control terminal; and
the apparatus further includes:
a fourth switch including a first terminal and a control terminal, the first terminal of the fourth switch coupled to the second terminal of the first switch and the first terminal of the first capacitor;
a first AND gate having a first input terminal, a second input terminal, and an output terminal, the first input terminal of the first AND gate coupled to a first output terminal of switch control circuitry, the second input terminal of the first AND gate coupled to an enable terminal, and the output terminal of the first AND gate coupled to the control terminal of the first switch; and
a second AND gate having a first input terminal, a second input terminal, and an output terminal, the first input terminal of the second AND gate coupled to a second output terminal of switch control circuitry, the second input terminal of the second AND gate coupled to the enable terminal, and the output terminal of the second AND gate coupled to the control terminal of the fourth switch.

10. The apparatus of claim 8, wherein the bias control circuitry includes:
a NOT gate having an input terminal and an output terminal, the input terminal coupled to an enable terminal; and
an AND gate having a first input terminal, a second input terminal, and an output terminal, the first input terminal of the AND gate coupled to switch control circuitry, the second input terminal of the AND gate coupled to the output terminal of the NOT gate, and the output terminal of the AND gate coupled to the control terminal of the third switch.

11. The apparatus of claim 8, further including:
a third capacitor having a first terminal and a second terminal;
an operational amplifier (op-amp) having an input terminal and an output terminal, the input terminal coupled to the first terminal of the third capacitor, the output terminal coupled to the second terminal of the third capacitor; and
a fourth switch having a first terminal and a second terminal, the first terminal of the fourth switch coupled to the second terminal of the first capacitor and the second terminal of the second capacitor, the second terminal of the fourth switch coupled to the first terminal of the third capacitor and the input terminal of the op-amp.

12. The apparatus of claim 11, further including a fifth switch coupled between (1) the common mode voltage terminal and (2) the second terminal of the first capacitor and the second terminal of the second capacitor.

13. The apparatus of claim 12, wherein the first switch is open, and the apparatus further includes switch control circuitry coupled to the second switch, the fourth switch, and the fifth switch, the switch control circuitry to:
control the second switch and the fifth switch to be closed during a first operational phase and open during a second operational phase; and
control the fourth switch to be open during the first operational phase and closed during the second operational phase.

14. The apparatus of claim 13, wherein the bias control circuitry is to control the third switch to be closed during the first operational phase and open during the second operational phase.

15. A method comprising:
controlling, with gain control circuitry, a first switch to be open, the first switch coupled to a first capacitor in series between an input voltage terminal and a common mode voltage terminal, the first switch including a first terminal coupled to the input voltage terminal;
controlling, with switch control circuitry, a second switch to be closed during a first operational phase and open during a second operational phase, the second switch coupled to a second capacitor in series between the input voltage terminal and the common mode voltage terminal, the second switch including a first terminal coupled to the input voltage terminal; and
controlling, with bias control circuitry, a third switch to be closed during the first operational phase and open during the second operational phase, the third switch coupled between a supply terminal and a terminal between the first switch and the first capacitor.

16. The method of claim 15, wherein the first capacitor includes a first terminal, the second capacitor includes a first terminal, the first capacitor is coupled to the common mode voltage terminal via the first terminal of the first capacitor, the second capacitor is coupled to the common mode voltage terminal via the first terminal of the second capacitor, and the method further includes controlling, with the switch control circuitry, a fourth switch to be open during the first operational phase and closed during the second operational phase, the fourth switch coupled between (1) a third capacitor and (2) the first terminal of the first capacitor and the first terminal of the second capacitor.

17. The method of claim 16, further including controlling, with the switch control circuitry, a fifth switch to be closed during the first operational phase and open during the second operational phase, the fifth switch coupled between (1) the common mode voltage terminal and (2) the first terminal of the first capacitor and the first terminal of the second capacitor.

18. The method of claim 15, further including:
generating, with the switch control circuitry, a first signal to initiate the first operational phase; and
generating, with the switch control circuitry, a second signal to initiate the second operational phase.

19. The method of claim 18, further including generating, with the gain control circuitry, a third signal to open the first switch, the third signal based on the first signal and an enable signal corresponding to the first switch.

20. The method of claim 18, further including, based on the first signal and an inverted value of an enable signal corresponding to the first switch, controlling the third switch to be closed during the first operational phase and open during the second operational phase.

* * * * *